United States Patent
Ueno et al.

(10) Patent No.: US 9,689,537 B2
(45) Date of Patent: Jun. 27, 2017

(54) LIGHT-EMITTING DEVICE, ILLUMINATION LIGHT SOURCE, AND ILLUMINATION DEVICE

(71) Applicant: PANASONIC INTELLECTUAL PROPERTY MANAGEMENT CO., LTD., Osaka (JP)

(72) Inventors: Yasuharu Ueno, Osaka (JP); Ryouji Yokotani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/650,615

(22) PCT Filed: Oct. 10, 2013

(86) PCT No.: PCT/JP2013/006047
§ 371 (c)(1),
(2) Date: Jun. 9, 2015

(87) PCT Pub. No.: WO2014/091655
PCT Pub. Date: Jun. 19, 2014

(65) Prior Publication Data
US 2015/0308632 A1    Oct. 29, 2015

(30) Foreign Application Priority Data

Dec. 13, 2012  (JP) .................. 2012-272301

(51) Int. Cl.
*F21V 1/00* (2006.01)
*F21V 11/00* (2015.01)
(Continued)

(52) U.S. Cl.
CPC .................. *F21K 9/30* (2013.01); *F21K 9/20* (2016.08); *F21K 9/23* (2016.08); *F21K 9/60* (2016.08);
(Continued)

(58) Field of Classification Search
CPC . F21K 9/30; F21K 9/1355; F21K 9/50; F21K 9/20; F21K 9/23; F21K 9/60;
(Continued)

(56) References Cited

U.S. PATENT DOCUMENTS 7,758,223 B2    7/2010  Osawa et al.
8,398,272 B2    3/2013  Osawa
(Continued)

FOREIGN PATENT DOCUMENTS

JP          10-242574       9/1998
JP          2002-299694     10/2002
(Continued)

OTHER PUBLICATIONS

Office Action issued in Japan Counterpart Patent Appl. No. 2014-551839, dated Aug. 25, 2015.
(Continued)

*Primary Examiner* — Anh Mai
*Assistant Examiner* — Glenn Zimmerman
(74) *Attorney, Agent, or Firm* — Greenblum & Bernstein, P.L.C.

(57) ABSTRACT

A light-emitting device includes: a substrate; a plurality of light-emitting elements arranged in an annular line on a main surface of the substrate; a sealing member which is annularly formed along the line of the plurality of light-emitting elements and seals the plurality of light-emitting elements; and a power supply part disposed on the main surface of the substrate and electrically connected to the plurality of light-emitting elements. The power supply part is located in an inner region interior to the sealing member formed in an annular shape.

20 Claims, 20 Drawing Sheets

(51) Int. Cl.
F21K 99/00 (2016.01)
F21S 8/02 (2006.01)
F21V 5/04 (2006.01)
F21V 23/00 (2015.01)
F21V 23/02 (2006.01)
F21V 23/06 (2006.01)
F21K 9/20 (2016.01)
F21K 9/23 (2016.01)
F21K 9/60 (2016.01)
F21V 3/04 (2006.01)
F21V 19/00 (2006.01)
F21V 29/76 (2015.01)
F21Y 115/10 (2016.01)

(52) U.S. Cl.
CPC ............... F21S 8/02 (2013.01); F21V 5/04 (2013.01); F21V 23/002 (2013.01); F21V 23/023 (2013.01); F21V 23/06 (2013.01); F21V 3/04 (2013.01); F21V 19/0035 (2013.01); F21V 19/0055 (2013.01); F21V 23/006 (2013.01); F21V 29/763 (2015.01); F21Y 2115/10 (2016.08); H01L 2224/45144 (2013.01); H01L 2224/48091 (2013.01); H01L 2224/48137 (2013.01); H01L 2924/181 (2013.01)

(58) Field of Classification Search
CPC .. F21S 5/04; F21S 8/02; F21V 23/002; F21V 23/023; F21V 23/06; F21V 3/04; F21V 19/0035; F21V 19/0055; F21V 23/006; F21V 29/763; F21V 5/04; F21Y 2101/02; F21Y 2115/10; H01L 2924/181; H01L 2224/48091; H01L 2224/48137; H01L 2224/45144
USPC .............. 362/235, 236, 237, 249.01, 249.06, 362/249.14
See application file for complete search history.

(56) References Cited

U.S. PATENT DOCUMENTS

| | | | |
|---|---|---|---|
| 8,541,805 B2 | 9/2013 | Motoya et al. | |
| 8,858,041 B2 | 10/2014 | Osawa et al. | |
| 8,979,315 B2 | 3/2015 | Osawa et al. | |
| 8,992,041 B2 | 3/2015 | Osawa | |
| 9,024,334 B2 | 5/2015 | Agatani et al. | |
| 9,028,089 B2 | 5/2015 | Kotera et al. | |
| 9,062,851 B2 | 6/2015 | Matsubayashi et al. | |
| 2006/0227558 A1 | 10/2006 | Osawa et al. | |
| 2008/0203897 A1* | 8/2008 | De Samber | H01L 33/642 313/498 |
| 2010/0237761 A1 | 9/2010 | Osawa et al. | |
| 2010/0237779 A1 | 9/2010 | Osawa et al. | |
| 2010/0244650 A1 | 9/2010 | Osawa et al. | |
| 2010/0244694 A1 | 9/2010 | Osawa et al. | |
| 2010/0253200 A1 | 10/2010 | Osawa et al. | |
| 2011/0006680 A1 | 1/2011 | Tanaka et al. | |
| 2011/0116252 A1* | 5/2011 | Agatani | F21K 9/00 362/84 |
| 2011/0156569 A1 | 6/2011 | Osawa | |
| 2011/0309386 A1 | 12/2011 | Osawa et al. | |
| 2011/0310606 A1 | 12/2011 | Osawa et al. | |
| 2012/0044669 A1 | 2/2012 | Ogata et al. | |
| 2012/0057371 A1 | 3/2012 | Kai et al. | |
| 2012/0063148 A1* | 3/2012 | Tanaka | F21K 9/00 362/296.01 |
| 2012/0294005 A1 | 11/2012 | Osawa et al. | |
| 2012/0294006 A1 | 11/2012 | Osawa et al. | |
| 2012/0300458 A1 | 11/2012 | Osawa et al. | |
| 2012/0300477 A1 | 11/2012 | Osawa et al. | |
| 2012/0306344 A1 | 12/2012 | Tanaka et al. | |
| 2012/0306352 A1 | 12/2012 | Tanaka et al. | |
| 2012/0306353 A1 | 12/2012 | Tanaka et al. | |
| 2012/0306397 A1 | 12/2012 | Tanaka et al. | |
| 2012/0307497 A1 | 12/2012 | Tanaka et al. | |
| 2012/0320601 A1* | 12/2012 | Motoya | H01L 25/0753 362/296.01 |
| 2013/0077285 A1* | 3/2013 | Isogai | F21V 23/006 362/84 |
| 2013/0148364 A1 | 6/2013 | Osawa | |
| 2014/0078744 A1 | 3/2014 | Osawa et al. | |
| 2014/0078750 A1 | 3/2014 | Osawa et al. | |
| 2014/0078751 A1 | 3/2014 | Osawa et al. | |
| 2014/0104837 A1 | 4/2014 | Osawa et al. | |
| 2014/0362586 A1* | 12/2014 | Wu | F21K 9/135 362/311.02 |
| 2015/0138775 A1* | 5/2015 | Hata | F21K 9/135 362/293 |

FOREIGN PATENT DOCUMENTS

| | | | |
|---|---|---|---|
| JP | 2003-059330 | 2/2003 | |
| JP | 2006-313717 | 11/2006 | |
| JP | 2008-124008 | 5/2008 | |
| JP | 2009-043447 | 2/2009 | |
| JP | WO 2009102003 A1 * | 8/2009 | ............... F21K 9/00 |
| JP | 2011-108744 | 6/2011 | |
| JP | 2011-238802 | 11/2011 | |
| JP | 2012-160426 | 8/2012 | |
| JP | 2012-190709 | 10/2012 | |
| JP | WO 2012132736 A1 * | 10/2012 | ............... F21K 9/135 |
| WO | 2009/102003 | 8/2009 | |
| WO | 2011/111399 | 9/2011 | |
| WO | 2011/135766 | 11/2011 | |
| WO | 2011/142097 | 11/2011 | |

OTHER PUBLICATIONS

U.S. Appl. No. 14/650,625 to Yokotani et al., filed Jun. 9, 2015.
Search report from PCT/JP2013/006047, mail date is Nov. 12, 2013.

* cited by examiner

LIGHT-EMITTING DEVICE, ILLUMINATION LIGHT SOURCE, AND ILLUMINATION DEVICE

TECHNICAL FIELD

The present invention relates to light-emitting devices, illumination light sources, and illumination devices, and in particular relates to a light-emitting device which uses light-emitting diodes (LEDs) and an illumination light source including the light-emitting device.

BACKGROUND ART

Due to their high efficiency and long life span, LEDs are used as light sources in a variety of products. In particular, research and development of lamps which use LEDs (i.e., LED lamps), as alternate illumination light sources for conventional fluorescent lamps and conventional bulb-shaped incandescent lamps, is advancing.

Examples of LED lamps include bulb-shaped LED lamps (LED bulbs) as an alternate for bulb-shaped fluorescent and incandescent lamps, and straight tube LED lamps as an alternate for straight tube fluorescent lamps. For example, Patent Literature (PTL) 1 discloses a conventional bulb-shaped LED lamp. Additionally, PTL 2 discloses a conventional straight tube LED lamp.

LED lamps include an LED module as the light source (light-emitting device). The LED module includes, for example, a mounting substrate and a plurality of LEDs mounted on the mounting substrate.

CITATION LIST

Patent Literature

[PTL 1] Japanese Unexamined Patent Application Publication No. 2006-313717
[PTL 2] Japanese Unexamined Patent Application Publication No. 2009-043447

SUMMARY OF INVENTION

Technical Problem

Examples of LED modules include chip on board (COB) LED modules in which an LED chip is mounted directly on the mounting substrate, and surface mount device (SMD) LED modules in which a plurality of packaged LED elements are mounted on the mounting substrate.

COB LED modules include, for example, a plurality of LED chips mounted in the central portion of a rectangular mounting substrate, and a circular wavelength converting member (phosphor-containing resin) which collectively seals the plurality of LED chips.

Since the LED chips in COB LED modules are densely arranged, COB LED modules have poor heat dissipating properties and light emitted from the sides of the LED chips gets absorbed by adjacent LED chips, resulting in poor light emission efficiency.

SMD LED modules include, in each LED element, a white container (package) having a cavity, an LED chip mounted in the cavity, and a wavelength converting member (phosphor-containing resin) filling the cavity.

Since the LED chip in each LED element in SMD LED modules is disposed in the white container (package), light does not emit from the sides of the white container. Consequently, the light emitted from LED modules is discontinuous and blotchy with noticeable bright spots, resulting in an uneven luminance distribution.

Moreover, both COB and SMD LED modules include, on the mounting substrate, a connector (power supply terminal) which is a part for connection with a power supply lead, and a zener diode which electrostatically protects the LED chip. The connector and the zener diode are disposed in a more peripheral position on the mounting substrate than the wavelength converting member, which is the light-emitting part.

However, when the connector and the zener diode are disposed in a more peripheral position on the mounting substrate than the light-emitting part (wavelength converting member), light emitted from the sides of the light-emitting part outward toward the edges of the mounting substrate is, for example, absorbed by the connector and zener diode, thereby reducing light emission efficiency, or reflected off the connector and zener diode, resulting in an uneven luminance distribution.

LED modules are fixed to, for example, a metal pedestal (heat sink) disposed inside the LED lamp. Methods of fixing the LED module and the pedestal together include screwing a holding member (e.g., a metal leaf spring) and the pedestal together next to the mounting substrate while the peripheral edge portion of the mounting substrate is held down by the holding member. In this case, the holding member is disposed so as to extend across the peripheral edge portion of the mounting substrate and the pedestal.

However, since the holding member is disposed in a more exterior position than the light-emitting part, light emitted from the sides of the light-emitting part outward toward the edges of the mounting substrate is blocked by the holding member. This leads to, for example, a reduction in light emission efficiency and an uneven luminance distribution resulting from light being scattered after being blocked by the holding member.

The present invention was conceived to solve the above problems and has an object to provide a light-emitting device, an illumination light source, and an illumination device with which a reduction in light emission efficiency can be inhibited and a uniform luminance distribution can be achieved.

Solution to Problem

In order to achieve the above object, one aspect of the light-emitting device according to the present invention includes a substrate, a plurality of light-emitting elements arranged in an annular line on a main surface of the substrate, a sealing member which is annularly formed along the line of the plurality of light-emitting elements and seals the plurality of light-emitting elements, and a power supply part disposed on the main surface of the substrate and electrically connected to the plurality of light-emitting elements. The power supply part is located in an inner region interior to the sealing member formed in an annular shape.

Moreover, in one aspect of the light-emitting device according to the present invention, the plurality of light-emitting elements may be arranged along a peripheral portion of the substrate.

Moreover, in one aspect of the light-emitting device according to the present invention, the substrate may have a first through-hole for passing through a lead which connects to the power supply part, and the first through-hole may be located in the inner region.

Moreover, in one aspect of the light-emitting device according to the present invention, the sealing member may be formed continuously, without interruption.

Moreover, in one aspect of the light-emitting device according to the present invention, the substrate may have a polygonal shape when viewed in a direction perpendicular to the main surface of the substrate, the substrate may have a notch in a portion of at least one side of the polygonal shape, and the sealing member may be interrupted by the notch.

In this case, a lead which connects to the power supply part may pass through the notch.

Moreover, in one aspect of the light-emitting device according to the present invention, the substrate may have a polygonal shape when viewed in a direction perpendicular to the main surface of the substrate, the plurality of light-emitting elements may each have a rectangular shape when viewed in the direction perpendicular to the main surface of the substrate, and a long side of the rectangular shape and a side of the polygonal shape may be substantially parallel.

Moreover, in one aspect of the light-emitting device according to the present invention, the substrate may have an octagonal shape when viewed in a direction perpendicular to the main surface of the substrate, and two opposing sides of the octagonal shape may be equal in length and parallel to each other, and two adjacent sides of the octagonal shape may have different lengths.

Moreover, in one aspect of the light-emitting device according to the present invention, the light-emitting device may further include a pad electrically connected to the plurality of light-emitting elements. The plurality of light-emitting elements may be arranged in a polygonal shape when viewed in a direction perpendicular to the main surface of the substrate, the pad may be located in a corner portion of the polygonal shape, and two of the plurality of light-emitting elements disposed about the corner portion may be wire bonded via the pad.

Moreover, in one aspect of the light-emitting device according to the present invention, the substrate may have a second through-hole for passing through a fixing member for fixing the substrate to a pedestal, and the second through-hole may be located in the inner region.

Moreover, in one aspect of the light-emitting device according to the present invention, the substrate may have a polygonal shape when viewed in a direction perpendicular to the main surface of the substrate, the polygonal shape being rectangular, hexagonal, or octagonal, and when the polygonal shape is divided into a plurality of orthants by connecting a midpoint of each side of the polygonal shape with a center point of the polygonal shape, the power supply part and the second through-hole may be located in different orthants among the plurality of orthants.

Moreover, in one aspect of the light-emitting device according to the present invention, the first through-hole may be located at the center point of the polygonal shape, or located in, among the plurality of orthants, an orthant opposing an orthant including the power supply part, across the center point of the polygonal shape.

Moreover, in one aspect of the light-emitting device according to the present invention, all of the plurality of light-emitting elements may be disposed at arbitrary intersections of lines of a virtual grid which are spaced at a uniform pitch on the substrate.

Moreover, in one aspect of the light-emitting device according to the present invention, the substrate may include a marker for indicating a mounting location of each of the plurality of light-emitting elements Moreover, in one aspect of the light-emitting device according to the present invention, the light-emitting device may further include a line patterned on the substrate, for electrically connecting the power supply part and the plurality of light-emitting elements. The line may be located in the inner region.

Moreover, in one aspect of the light-emitting device according to the present invention, the light-emitting device may further include a protective element which electrostatically protects the plurality of light-emitting elements. The protective element may be located in the inner region.

Moreover, in one aspect of the light-emitting device according to the present invention, the sealing member may include a wavelength converting material which converts a wavelength of light emitted from the plurality of light-emitting elements.

Moreover, one aspect of the illumination light source according to the present invention may include the light-emitting device according to any one of the foregoing aspects.

Moreover, one aspect of the illumination device according to the present invention may include the light-emitting device according to any one of the foregoing aspects.

Moreover, in one aspect of the light-emitting device according to the present invention, the light-emitting device may further include a lens which transmits light emitted from the sealing member, and a lead including a connector part which connects to the power supply part. The lens includes a holding part which holds down the connector part.

Advantageous Effects of Invention

With the present invention, a reduction in light emission efficiency can be inhibited and an even luminance distribution can be achieved.

DESCRIPTION OF EMBODIMENTS

Figure 1:
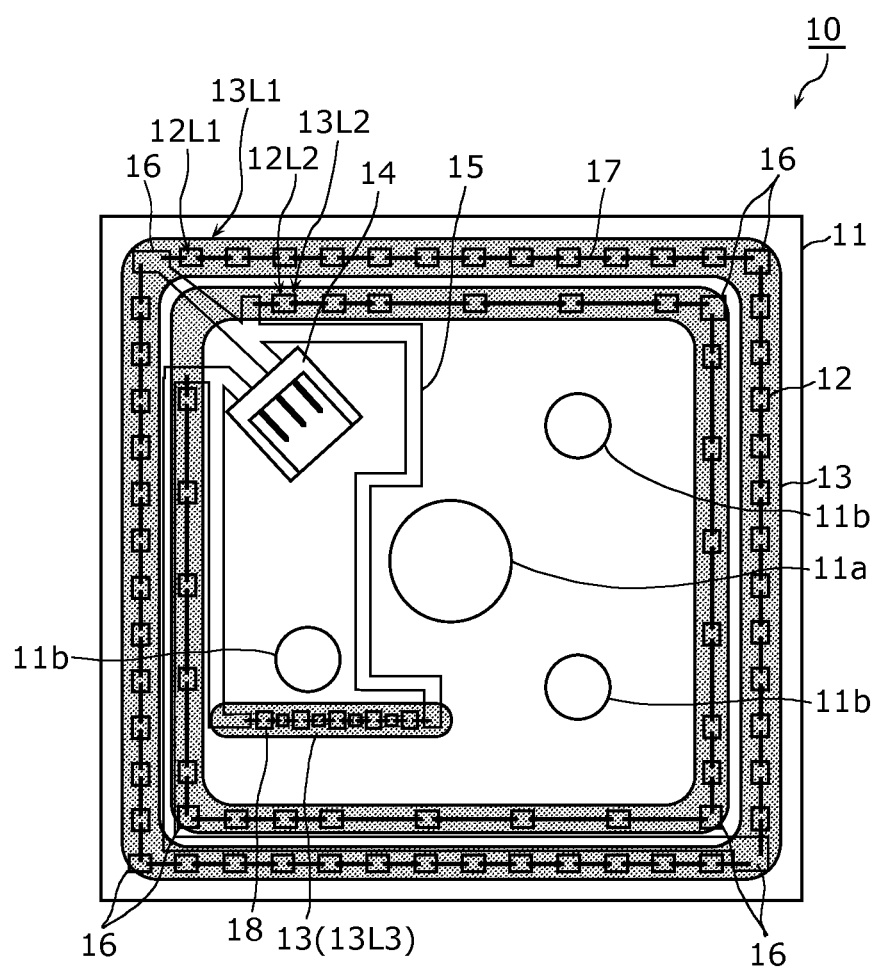
FIG. 1 is a plan view of a light-emitting device according to Embodiment 1 of the present invention.

Hereinafter the light-emitting device, illumination light source, and illumination device according to embodiments of the present invention will be described with reference to the drawings. It should be noted that each of the following embodiments shows one specific preferred example of the present invention. The numerical values, shapes, materials, structural elements, the arrangement and connection of the structural elements etc. shown in the following embodiments are mere examples, and therefore do not limit the present invention. As such, among the structural elements in the following embodiments, elements not recited in any one of the independent claims which indicate the broadest concepts of the present invention are described as arbitrary structural elements.

Note that the respective figures are schematic diagrams and are not necessarily precise illustrations. Additionally, similar structural elements share like reference numbers in the drawings.

(Embodiment 1)

Figure 2:
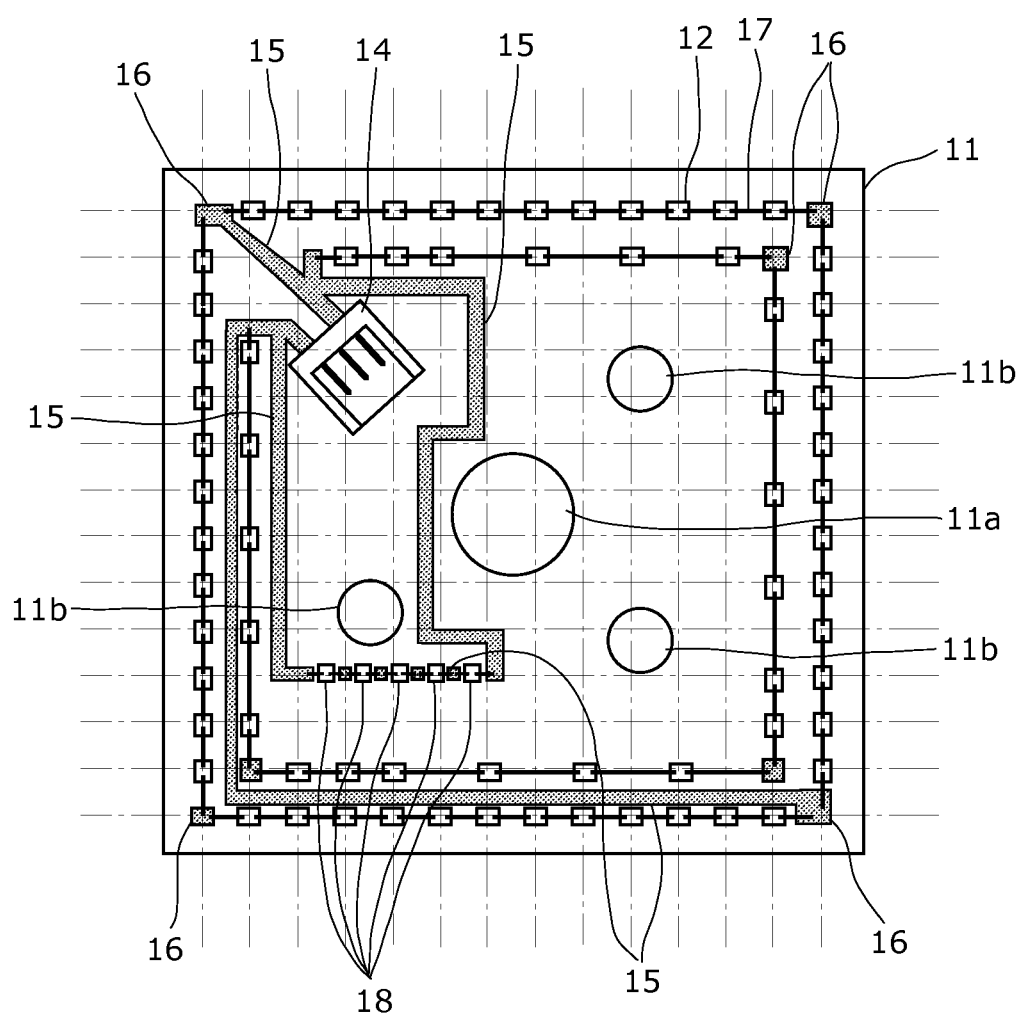
FIG. 2 is a plan view of a light-emitting device (before a sealing member is formed) according to Embodiment 1 of the present invention.

First, the structure of the light-emitting device 10 according to Embodiment 1 of the present invention will be described with reference to FIG. 1 and FIG. 2. FIG. 1 is a plan view of the light-emitting device according to Embodiment 1, and FIG. 2 is a plan view of the same light-emitting device illustrated in FIG. 1 before the sealing member is formed.

The light-emitting device 10 is a light-emitting module including a plurality of light-emitting elements, and is configured to emit light of a predetermined color (wavelength). The light-emitting device 10 according to Embodiment 1 is an LED module including a plurality of LEDs, and emits white light.

As illustrated in FIG. 1, the light-emitting device 10 includes a substrate 11, a plurality of LEDs 12 mounted on the main surface of the substrate 11, a sealing member 13 sealing the LEDs 12, and a power supply part 14 which supplies electricity to the LEDs 12. The light-emitting device 10 further includes a line 15 and pads 16 patterned in predetermined shapes on the substrate 11, wires 17 connected to the LEDs 12, and protective elements 18 which electrostatically protect the LEDs 12.

The light-emitting device 10 according to Embodiment 1 is a COB light-emitting device, where each of the LEDs 12 is a bare chip and is directly mounted on the substrate 11.

The LEDs 12 are arranged in an annular shape on the main surface of the substrate 11. In Embodiment 1, the plurality of LEDs 12 are arranged in a line forming a square frame shape (shape of an outline of a square). Moreover, as illustrated in FIG. 1, the LEDs 12 on the substrate 11 are arranged so as to form dual element lines. The two element lines include the outer first element line 12L1 and the inner second element line 12L2. The first element line 12L1 and the second element line 12L2 are each formed in a square annular shape where the plurality of LEDs 12 are arranged in a single line, one after another.

The sealing member 13 is annularly formed along each line of the LEDs 12, so as to cover the LEDs 12. In Embodiment 1, since the plurality of LEDs 12 are arranged in lines so as to form square frame shapes, the sealing member 13 is formed in linear shapes along the square lines of the LEDs 12. Moreover, since the element lines of the LEDs 12 are arranged in dual annular shapes, the sealing member 13 is also formed in dual annular-shaped sealing lines. The dual sealing lines include an outer first sealing line 13L1 and an inner second sealing line 13L2.

In Embodiment 1, the outer first sealing line 13L1 is formed continuously, without interruption, so as to collectively seal all LEDs 12 included in the first element line 12L1. Similarly, the inner second sealing line 13L2 is formed continuously, without interruption, so as to collectively seal all LEDs 12 included in the second element line 12L2.

Since the sealing member 13 includes a phosphor, the sealing member 13 functions as a light-emitting part. In other words, the first sealing line 13L1 and the second sealing line 13L2 each are annular light-emitting parts from which white light is emitted.

Moreover, on the substrate 11, the region interior to the annular sealing member 13 is defined as an inner region, and the power supply part 14 is disposed in the inner region. In other words, the power supply part 14 is disposed in a region surrounded by the annular light-emitting part.

In Embodiment 1, the first element line 12L1 and the second element line 12L2 (the first sealing line 13L1 and the second sealing line 13L2) are provided as plural annular light-emitting parts. Here, the power supply part 14 is at least disposed in an inner region interior to the outer first element line 12L1 (the first sealing line 13L1), and more preferably disposed in an inner region interior to the inner second element line 12L2 (the second sealing line 13L2). In Embodiment 1, the power supply part 14 is disposed in the inner region interior to the inner second element line 12L2 (the second sealing line 13L2), as illustrated in FIG. 1.

Note that in Embodiment 1, the LEDs 12 are arranged in dual element lines—the first element line 12L1 and the second element line 12L2—and the sealing member 13 is formed in dual sealing lines—the first sealing line 13L1 and the second sealing line 13L2—but this example is not limiting.

Figure 3:
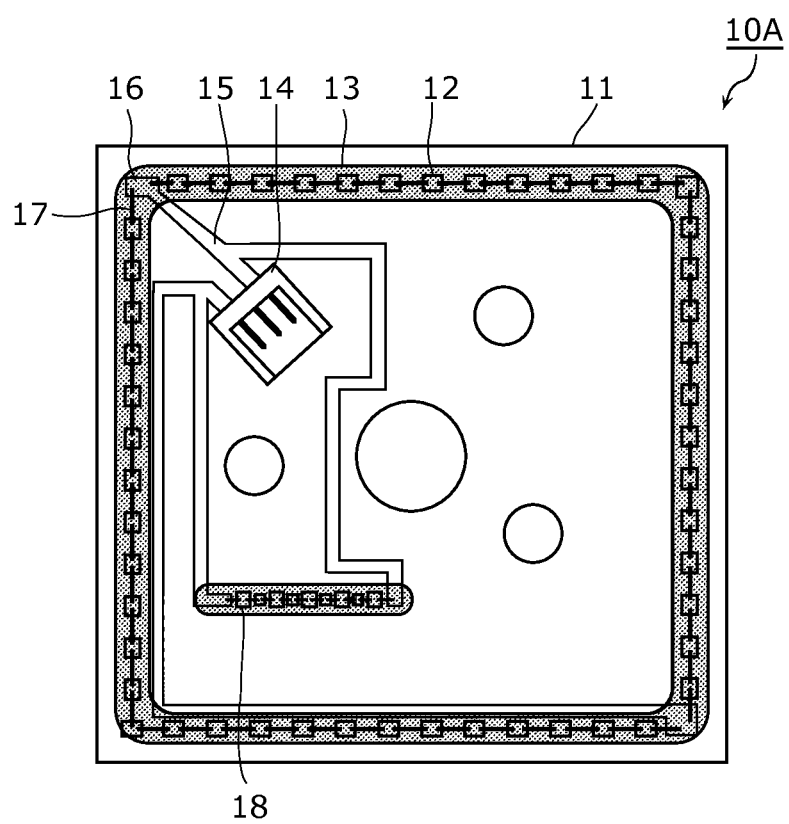
FIG. 3 is a plan view of a light-emitting device according to a variation of Embodiment 1 of the present invention.

For example, the light-emitting device 10A illustrated in FIG. 3 is also conceivable. FIG. 3 is a plan view of the light-emitting device according to a variation of Embodiment 1 of the present invention.

As illustrated in FIG. 3, the LEDs 12 can be arranged in a single annular element line, and the sealing member 13 can be formed in a single annular sealing line. In FIG. 3, the element line of the LEDs 12 corresponds to the first element line 12L1 illustrated in FIG. 1, and the sealing line of the sealing member 13 corresponds to the first sealing line 13L1 illustrated in FIG. 1. Note that except for the first element line 12L1 and the first sealing line 13L1, FIG. 3 is the same as FIG. 1.

Hereinafter, each structural element in the light-emitting device 10 according to Embodiment 1 will be described in detail. Note that the following also applies to the light-emitting device 10A illustrated in FIG. 3.

(Substrate)

The substrate 11 is an LED mounting substrate for mounting the LEDs 12. The substrate 11 according to Embodiment 1 is a circuit board on which a line 15 is formed. As illustrated in FIG. 1, a substrate having a square shape in a plan view (i.e., when viewed in a direction perpendicular to the main surface of the substrate 11), for example, can be used as the substrate 11. Note that the plan view shape of the substrate 11 is not limited to a square shape, and may be a polygonal shape, namely, a quadrilateral shape such as a rectangle, a hexagon, or an octagon; a circular shape; or another shape.

An electrically insulated substrate such as a ceramic substrate made of ceramic, a resin substrate made of resin, or a glass substrate may be used as the substrate 11 and, alternatively, a metal based substrate made of a metal plate covered with an electrically insulating film (metal substrate) may be used as the substrate 11.

The ceramic substrate may be made of, for example, aluminum oxide (alumina) or aluminum nitride. The resin substrate may be, for example, a glass epoxy substrate or a flexible substrate made of, for example, polyimide. The metal based substrate may be, for example, an aluminum alloy substrate, an iron alloy substrate, or a copper alloy substrate.

A white substrate having a high optical reflectivity (for example, an optical reflectivity of 90% or higher) is preferably used as the substrate 11. Using a white substrate allows for light from the LEDs 12 to be reflected off the surface of the substrate 11, thereby increasing the light extraction rate of the light-emitting device 10.

In Embodiment 1, a ceramic substrate is used as the substrate 11. Ceramic substrates have a higher rate of thermal conductivity than resin substrates, and can therefore efficiently radiate heat from the LEDs 12. Moreover, ceramic substrates have a low rate of degradation over time, and also have excellent heat resistance properties.

More specifically, a white polycrystalline alumina substrate (polycrystalline ceramic substrate) formed of sintered alumina particles and having a thickness of approximately 1 mm may be used as the substrate 11. Polycrystalline alumina substrates can be manufactured by pressure forming by adding a binder to a mixture of alumina particles (base material) and a scattering substance or a sintering additive (additive agent), and then sintering the result. Note that due to the sintering, the size of the grains of the base material, alumina particles, increase in the crystallization.

The substrate 11 has a first through-hole 11a passing therethrough. The first through-hole 11a is an opening for passing through a lead (not shown in the Drawings) connected to the power supply part 14. The first through-hole 11a is located in the region interior to the sealing member 13 (i.e., in the inner region), and can be formed in, for example, the central portion of the substrate 11.

The substrate 11 also has a second through-hole 11b passing therethrough. The second through-hole 11b is an opening for passing through a fixing member for fixing the substrate 11 to the pedestal. The second through-hole 11b is located in the region interior to the sealing member 13 (i.e., in the inner region), and can be formed in, for example, three locations on the substrate 11, as illustrated in FIG. 1. Moreover, the fixing member is, for example, a fastener (screw, bolt and nut, etc.) for, for example, fastening and fixing the substrate 11 to the pedestal. Here, the second through-hole 11b is an opening for a screw.

In Embodiment 1, the first through-hole 11a and the second through-hole 11b are both formed in the inner region interior to the second sealing line 13L2. The first through-hole 11a and the second through-hole 11b are formed by, for example, laser cutting the ceramic substrate.

(LEDs)

The LEDs 12 are one example of the light-emitting elements, and are semiconductor light-emitting elements that emit light in response to predetermined power. LEDs having the same Vf properties can be used for the plurality of LEDs 12 on the substrate 11, but each LED 12 may have slightly different Vf properties, so long as the total Vf for the whole line of LEDs 12 connected in series is within a predetermined margin. Moreover, each LED 12 is a bare chip that emits monochromatic visible light, and in Embodiment 1, a blue LED chip that emits blue light when energized is used for the LED 12. A gallium nitride semiconductor light-emitting element formed from InGaN material, for example, and having a central wavelength of 440 nm to 470 nm, can be used as the blue LED chip.

As described above, the LEDs 12 on the substrate 11 are separated into two lines—the outer first element line 12L1 and the inner second element line 12L2.

As illustrated in FIG. 1, the LEDs 12 in the first element line 12L1 are arranged along the peripheral portion of the substrate 11. More specifically, the LEDs 12 in the first element line 12L1 are arranged in a single line along each of the four edges of the square substrate 11, in the vicinity of the side.

The second element line 12L2 is disposed adjacent to the first element line 12L1 so as to be similar in shape to the first element line 12L1. More specifically, the LEDs 12 in the second element line 12L2 are arranged so as to be parallel to the first element line 12L1.

Note that in Embodiment 1, 72 LEDs 12 are mounted on the substrate 11 in a 24s3p configuration. More specifically, the outer first element line 12L1 includes 48 LEDs 12 connected in a 24s2p configuration. The inner second element line 12L2 includes 24 LEDs 12 connected in series.

Here, as illustrated in FIG. 2, when the region (square region) defined by the main surface of the substrate 11 is overlaid with a virtual grid of lines spaced at a uniform pitch, all of the LEDs 12 mounted on the substrate 11 are disposed at arbitrary intersections of the grid lines on the substrate 11. The intersections of the grid lines are intersections of a plurality of virtual row lines and a plurality of virtual column lines that intersect at right angles.

Arranging the LEDs 12 to be positioned at intersections of the virtual grid lines as described above makes mounting all of the LEDs 12 and all of the wires 17 simple. More specifically, bonding (die bonding) of the LEDs 12 can be performed at a uniform feed pitch, meaning that only an either-or decision of whether to mount an LED 12 at an intersection of the grid lines needs to be made, whereby all LEDs 12 can be bonded in a single operation. This also applies to the wires 17; all of the wires can be wire bonded in a single operation. This makes it possible to simplify the processes of die bonding the LEDs 12 and wire bonding the wires 17, and thus reduce manufacturing costs.

Moreover, in Embodiment 1, the LEDs 12 have a rectangular shape in a plan view (i.e., when viewed in a direction perpendicular to the main surface of the substrate 11). Here, each LED 12 is preferably arranged such that a long side of the rectangular shape of the LED 12 is substantially parallel with an adjacent side of the polygonal substrate 11. In other words, the LEDs 12 are preferably arranged such that long sides of the LEDs 12 are aligned with the adjacent edge of the substrate 11. For example, when the substrate 11 has a square shape in a plan view, each LED 12 may be arranged such that the long side of the rectangular shape of the LED 12 and one side of the square shape of the substrate 11 are parallel to each other.

By arranging the LEDs 12 in this orientation, the luminous flux of light emitted in a direction perpendicular to the direction in which adjacent LEDs 12 are aligned (i.e., perpendicular to the direction in which the sealing member 13 is applied), that is to say, the luminous flux of light emitted from the long sides of the LEDs 12 increases, thereby increasing the light extraction rate.

Moreover, each LED 12 has a p-side electrode (not shown in the Drawings) and an n-side electrode (not shown in the Drawings), and a wire 17 is connected to the p-side electrode and a wire 17 is connected to the n-side electrode. In Embodiment 1, at each edge of the substrate 11, adjacent LEDs 12 are directly connected by the wire 17. In other words, the LEDs 12 at each edge of the substrate 11 are wire bonded in a chip-to-chip configuration, and among two adjacent LEDs 12, the cathode of one LED 12 is connected with the anode of the other LED 12 by the wire 17.

Figure 4:
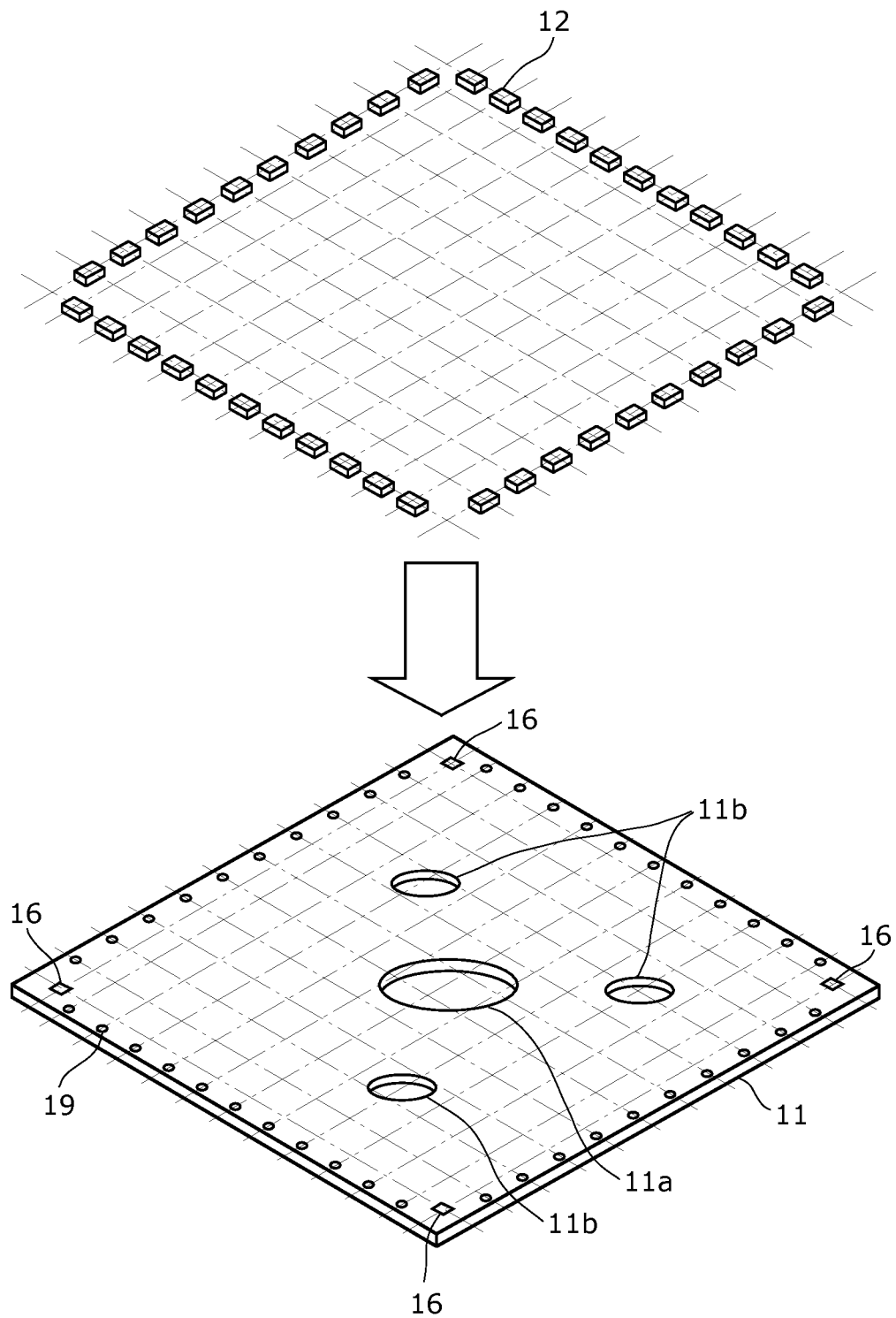
FIG. 4 illustrates how LEDs are mounted to a substrate in a light-emitting device according to Embodiment 1 of the present invention.

Next, the method used to mount the LEDs 12 will be described with reference to FIG. 4. FIG. 4 illustrates how LEDs are mounted to the substrate in the light-emitting device according to Embodiment 1 of the present invention.

Regarding the substrate 11 in FIG. 4, note that only configurations regarding the markers 19, the first through-hole 11a, and the second through-hole 11b are illustrated. Moreover, the grid lines and LEDs illustrated in FIG. 4 do not match the grid lines and LEDs illustrated in FIG. 2.

As illustrated in FIG. 4, a plurality of markers 19 for indicating positions for mounting the LEDs 12 are formed on the substrate 11. The markers 19 are formed in a line along each edge of the substrate 11 and spaced at a uniform pitch in positions corresponding to intersections of virtual row lines and virtual column lines that form the above-described grid. The markers 19 can be patterned at the same time as the line 15 and the pads 16, and, for example, can be configured as approximately 0.3 mm circles of thin metal film spaced apart by 5 to 6 mm.

When mounting the LEDs 12 on the substrate 11, the predetermined mounting positions of the LEDs 12 can be identified by capturing an image of the markers 19 with, for example, an imaging unit to detect the markers 19. This simplifies the process of mounting the LEDs 12, thereby reducing manufacturing costs. In particular, when the LEDs 12 are wire bonded in a chip-to-chip configuration, such as is the case with Embodiment 1, using the markers 19 makes detection of attachment positions of the wires 17 simple and fast.

Note that the markers 19 may be formed so as to correspond to the LEDs 12 in a one-to-one relationship and, alternatively, may be formed such that one marker 19 corresponds to a plurality of chips (for example, three chips).

(Sealing Member)

The sealing member 13 (the first sealing line 13L1, the second sealing line 13L2) can be made from, for example, a light-transmissive resin material and, if the wavelength of the light from the LEDs 12 is to be converted to a predetermined wavelength, can be mixed with a wavelength converting material. The sealing member 13 according to Embodiment 1 includes a phosphor as the wavelength converting material, and is a wavelength converting member that converts the wavelength (color) of the light emitted by the LEDs 12. The sealing member 13 can be made from an electrically insulating resin material (phosphor-containing resin) containing phosphor particles. The phosphor particles are excited by the light emitted from the LEDs 12 and emit light of a desired color (wavelength).

Silicon resin, for example, can be used as the resin material for the sealing member 13. Moreover, a light diffusing material may be dispersed in the sealing member 13. Note that the sealing member 13 is not required to be formed from a resin material; the sealing member 13 may be formed from an organic material such as a fluorine based resin or an inorganic material such as glass having a low melting point or sol-gel glass.

When the LEDs 12 are blue LEDs that emit blue light, in order to achieve a white light, YAG yellow phosphor particles, for example, can be used as the phosphor particles contained in the sealing member 13. With this, the wavelength of a portion of the blue light emitted by the LEDs 12 is converted into yellow light by the yellow phosphor particles contained in the sealing member 13. The blue light not absorbed by the yellow phosphor particles and the yellow light converted by the yellow phosphors are diffused and mixed in the sealing member 13, resulting in emission of white light from the sealing member 13. Particles such as silica particles can be used as the diffusing material.

The sealing member 13 according to Embodiment 1 is a phosphor-containing resin formed by dispersing predetermined phosphor particles in a silicon resin, and is applied to the main surface of the substrate 11 with a dispenser and then hardened.

More specifically, the dispensing nozzle of the dispenser is positioned facing a predetermined position on the substrate 11 and is translated in a given direction relative to the substrate 11 while dispensing the sealing member material (phosphor-containing resin) along the direction in which the LEDs 12 are arranged. The sealing member material is dispensed so as to cover the LEDs 12 and the wires 17.

In Embodiment 1, since the sealing member 13 is formed in an annular shape without interruption, the sealing member material is applied in a single operation, starting and ending at the point on the substrate 11, similar to drawing a square shape in a single stroke. After the sealing member material is applied, the sealing member material is hardened using a predetermined method.

Note that the cross sectional shape of the applied sealing member 13 taken along a direction perpendicular to the lengthwise direction of the sealing member 13 is, for example, an approximate semicircle.

Moreover, the protective elements 18 are sealed by the sealing member 13 (the third sealing line 13L3). The sealing member 13 (the third sealing line 13L3) can be formed along the row of protective elements 18, and in Embodiment 1, is formed in a straight line. The sealing member 13 covering the protective elements 18 can be formed with the same method and materials used to form the sealing member 13 sealing the LEDs 12. Covering the protective elements 18 with the sealing member 13 inhibits the deterioration of the protective elements 18.

Note that the sealing member 13 covering the protective elements 18 is not required to contain a phosphor, but by using the same material for the sealing member 13 sealing the protective elements 18 and the sealing member 13 sealing the LEDs 12, the protective elements 18 and the LEDs 12 can be sealed in the same process. This reduces manufacturing costs.

(Power Supply Part)

The power supply part 14 (power supply terminal) is a base connector that is an external connection terminal (electrode terminal) that receives predetermined power from outside the light-emitting device 10. In Embodiment 1, the power supply part 14 receives DC power for causing the LEDs 12 to emit light, and supplies the received DC power to each LED 12 via the line 15 and the wires 17.

The power supply part 14 according to Embodiment 1 is a socket receptacle, and includes a resin socket and a plurality of electrically conductive pins for receiving DC power. The plurality of electrically conductive pins include a positive voltage electrically conductive pin and a negative voltage electrically conductive pin that are electrically connected to the line 15 formed on the substrate 11.

The power supply part 14 receives power as a result of the connector part (socket connector) of the power supply lead being connected to the socket of the power supply part 14.

Note that instead of a socket receptacle, a metal electrode may be used as the power supply part 14. In this case, the metal electrode may include a positive voltage metal electrode and a negative voltage metal electrode, and can be patterned at the same time as the line 15, for example.

(Line)

The line 15 is formed for electrically connecting the plurality of LEDs 12 in the first element line 12L1 and the second element line 12L2 with the power supply part 14. In other words, the line 15 can be an electrically conductive line through which current for causing the LEDs 12 to emit light flows, such as a metal line. Power supplied to the light-emitting device 10 is supplied to the LEDs 12 via the line 15.

As illustrated in FIG. 2, the line 15 can be formed in a predetermined shape such that the plurality of LEDs 12 on the substrate 11 are electrically connected in a predetermined configuration. In Embodiment 1, the line 15 is patterned so as to configure the 72 LEDs 12 in a 24s3p configuration.

Moreover, the line 15 is also formed for electrically connecting the protective elements 18 and the power supply part 14. Moreover, the line 15 is also formed as islands between each protective element 18, and the protective elements 18 and the islands of the line 15 are connected by wires 17.

The line 15 can be formed by patterning or printing a metal film of a metal material, for example. Gold (Au), silver (Ag), and copper (Cu), for example, can be used for the metal material for the line 15. The line 15 according to Embodiment 1 is formed from gold.

In Embodiment 1, the line 15 is formed in the inner region interior to the sealing member 13 (i.e., formed in the inner region). More specifically, the line 15 is formed in the inner region interior to the second sealing line 13L2.

Note that the portion of the line 15 exposed from the sealing member 13 is preferably covered by a glass film (glass coating film) of a glass material, or a resin film (resin coating film) of a resin material. This makes it possible to increase the electrical insulation properties of the light-emitting device 10 and increase the reflectivity of the surface of the substrate 11.

(Pads)

As illustrated in FIG. 1 and the FIG. 2, the pads 16 are electrically connected to the plurality of LEDs 12 and the line 15. The pads 16 are formed in corners (corner portions) of the shape in which the LEDs 12 are arranged. In other words, when the shape in which the first element line 12L1 and the second element line 12L2 are arranged is a polygonal shape in a plan view of the substrate 11, the pads 16 are formed in the corners of the polygonal shape. In other words, the pads 16 are disposed so as to become part of the same line of LEDs 12 in the first element line 12L1 and the second element line 12L2, and each pad 16 disposed in each corner along with the plurality of LEDs 12 disposed to correspond with the edges collectively form the polygonal shape. For example, when the shape in which the annular first element line 12L1 and the annular second element line 12L2 are arranged is a square, the pads 16 are formed in the four corners of the square.

Moreover, in Embodiment 1, since the shapes of the first element line 12L1, the second element line 12L2, and the substrate 11 are squares, the pads 16 are formed in positions corresponding to the corners of the substrate 11. In other words, since the substrate 11 is square in a plan view, the pads 16 are formed in the four corners of the square shape.

Figure 5:
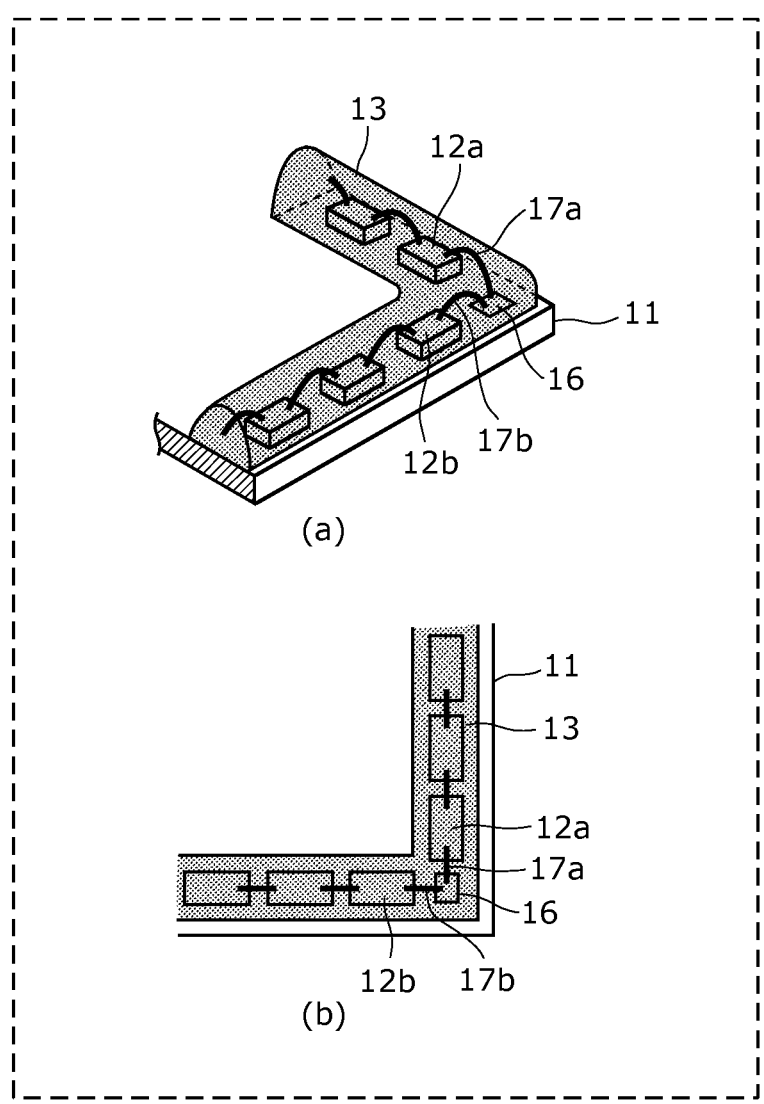
In FIG. 5, (a) is an enlarged perspective view of a corner portion of a substrate in a light-emitting device according to Embodiment 1 of the present invention, and (b) is an enlarged plan view of the corner portion of the substrate illustrated in (a).

As illustrated by (a) and (b) in FIG. 5, in the first element line 12L1 and in the second element line 12L2, the two LEDs 12 disposed about the corner are wire bonded via the pad 16. In Embodiment 1, the two LEDs closest to the corner of the substrate 11, i.e., the LEDs on either side of the corner, are wire bonded to the pad 16.

More specifically, as illustrated by (a) and (b) in FIG. 5, two LEDs—the LED 12a and the LED 12b—are disposed along a path that bends sharply at the corner of the substrate 11 (the first element line 12L1), the LED 12a and the pad 16 are connected via the wire 17a, and the LED 12b and the pad 16 are connected via the wire 17b. In other words, the pad 16 functions as an electrode for connecting two LEDs 12 disposed about the corner of the substrate 11 (the first element line 12L1).

This configuration makes it easier to form the sealing member 13, and inhibits the wire 17 from protruding out from the sealing member 13.

Figure 6:
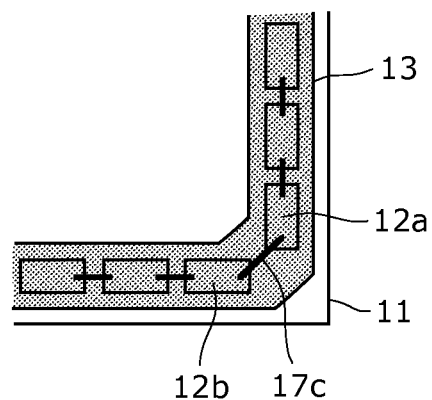
FIG. 6 is an enlarged plan view of a corner portion of a substrate in a light-emitting device according to a comparative example.

In other words, as shown by the comparative example illustrated in FIG. 6, when the pads 16 are not formed in the corners of the substrate 11 (the first element line 12L1) and the two LEDs—the LED 12a and the LED 12b—disposed about the corner are wire bonded together in a chip-to-chip configuration, the wire 17c connecting the LED 12a and the LED 12b is oriented in a diagonal direction and also longer.

In this case, since the sealing member 13 is formed along the direction in which the wires are attached, the sealing member 13 is also formed in a diagonal direction. As a result, when applying the sealing member 13, the number of changes in the direction (angle) of application needed to be made at the corner (two times in FIG. 6) increases, complicating the application process of the sealing member 13 and increasing costs. Moreover, increasing the length of the wire 17c increases the probability that the wire 17c will protrude out from the sealing member 13 and light from the sealing member 13 will be absorbed or reflected off the protruding wire 17c, thereby reducing the uniformity of luminance in the light-emitting device 10.

Conversely, as illustrated by (a) and (b) in FIG. 5, by forming the pads 16 in the corners of the substrate 11 (the first element line 12L1), it is possible to reduce the number of changes in the direction (angle) of application needed to be made at the corner when applying the sealing member 13 (one time in FIG. 5). This makes it possible to simplify the application process of the sealing member 13 and thus reduce manufacturing costs. Moreover, by connecting the LED 12a and LED 12b with the wire 17a and wire 17b via the pad 16, it is possible to reduce the length of the wire 17a and wire 17b compared to the wire 17c illustrated in FIG. 6. Since this makes it possible to inhibit the wire from protruding out from the sealing member 13, a decrease in the uniformity of luminance resulting from the protruding wire can be inhibited. Furthermore, since the width of the sealing member 13 before and after the corner of the substrate 11 can be made uniform, chromatic unevenness can be inhibited.

Note that this also applies to the second element line 12L2; by forming the pads 16 in the corners, the sealing member 13 can be easily formed and protrusion of the wire 17 from the sealing member 13 can be inhibited.

(Wire)

The wire 17 is, for example, an electrically conductive wire such as a gold wire. As described above, at each edge of the substrate 11, the wire 17 directly connects adjacent LEDs 12 together. Moreover, as described above, at the corners of the substrate 11 (first element line 12L1, second element line 12L2), the wire 17 connects the LEDs 12 and the pads 16. The wires 17 are preferably embedded within the sealing member 13 so as not to be exposed from the sealing member 13.

Moreover, in Embodiment 1, the LEDs 12 are configured in a 24s3p configuration, and in portions of the inner second element line 12L2, the gap between adjacent LEDs 12 is increased. Here, the length of the wire 17 is also increased, and in FIG. 1 and FIG. 2, the length is equal to two pitches.

Note that if the length of the wire 17 is too long, the wire 17 may protrude out from the sealing member 13 or droop and contact the top of the LED 12, so it is preferable that the length of the wire 17 is not too long. For example, the wire 17 may be kept to a length equal to two pitches.

Moreover, electrode pads may be formed as islands between adjacent LEDs 12 in locations where the lengths of the wires 17 are long. Since this makes it possible to shorten the length of the wire 17, the wire 17 can be inhibited from protruding out from the sealing member 13 or drooping and contacting the top of an LED 12.

(Protective Element)

The protective element 18 prevents breakdown of the LEDs 12—which have a low peak inverse voltage—due to static electricity of a reverse polarity forming on the substrate 11. As such, the protective element 18 is disposed so as to be connected in parallel in a reverse polarity with respect to the LEDs 12.

A zener diode, for example, can be used as the protective element 18. Moreover, one or more protective elements 18 may be mounted on the substrate 11. As illustrated in FIG. 1 and FIG. 2, in Embodiment 1, five zener diodes are mounted as protective elements 18.

Moreover, the protective elements 18 are arranged in the region interior to the sealing member 13 (i.e., arranged in the inner region). In Embodiment 1, the protective elements 18 are arranged in the inner region interior to the second sealing line 13L2.

The light-emitting device 10 according to Embodiment 1 has herein been described.

With the light-emitting device 10 according to Embodiment 1, the sealing member 13 is formed in an annular shape so as to cover the annularly arranged LEDs 12, and the power supply part 14 electrically connected to the LEDs 12 is disposed in the inner region interior to the annular sealing member 13. In other words, the power supply part 14 is disposed in the inner region interior to the annular light-emitting part configured of the LEDs 12 and the sealing member 13.

By arranging the LEDs 12 in an annular line in this manner, it is possible to inhibit a reduction in heat dissipating properties caused by densely arranged LEDs 12, and inhibit a reduction in light emission efficiency. Moreover, since the sealing member 13 is formed in line shape and collectively covers the LEDs 12 arranged in an annular line, it is possible to achieve emission of light in a continuous linear shape. Moreover, since the power supply part 14 is disposed in the inner region interior to the annular sealing member 13, light emitting from the sides of the sealing member 13 outward toward the edges of the substrate 11 is not affected by the power supply part 14. In other words, a reduction in light emission efficiency due to the power supply part 14 absorbing light emitting from the sides of the sealing member 13 outward toward the edges of the substrate 11 can be inhibited and an unevenness in luminance distribution due to the power supply part 14 reflecting light emitting from the sides of the sealing member 13 outward toward the edges of the substrate 11 can be inhibited.

Consequently, according to Embodiment 1, a light-emitting device capable of inhibiting a reduction in light emission efficiency and having an even luminance distribution can be achieved. Moreover, since the light-emitting device 10 according to Embodiment 1 employs a COB structure, light can be emitted not only in a direction perpendicular to the main surface of the substrate 11 (i.e., upward), but in directions horizontal to the main surface of the substrate 11 (i.e., outward toward the edges) as well. With this, a light-emitting device having wide light distribution characteristics can be achieved.

Moreover, in Embodiment 1, the plurality of LEDs 12 mounted on the substrate 11 are arranged along the peripheral portion of the substrate 11.

This configuration increases the heat dissipating properties and light emission efficiency of the light-emitting device 10 since the plurality of LEDs 12 are dispersedly arranged at the peripheral portion of the substrate 11 rather than being densely arranged. Moreover, by arranging the LEDs 12 at the peripheral portion of the substrate 11, the heat transfer path from the LEDs 12 to outside the substrate 11 can be shortened. Accordingly, a light-emitting device with superior heat dissipation properties can be achieved since heat generated by the LEDs 12 can be efficiently dissipated out of the substrate 11.

Furthermore, since the LEDs 12 are arranged along the peripheral portion of the substrate 11, the sealing member 13 is formed at the peripheral portion of the substrate 11. Consequently, a light-emitting device capable of further inhibiting a reduction in light emission efficiency and having a more even luminance distribution can be achieved since no obstruction that reflects or absorbs light emitted from the light-emitting part is arranged in the region exterior to the light-emitting part (the LEDs 12, the sealing member 13).

Moreover, in Embodiment 1, the sealing member 13 is formed continuously, without interruption.

This achieves an even, linear emission of light that is continuous around the entire perimeter of the substrate 11. Consequently, a light-emitting device having a more even luminance distribution can be achieved.

Moreover, in Embodiment 1, a first through-hole 11*a* for passing through the lead connected to the power supply part 14 is located in the inner region interior to the sealing member 13 formed in an annular shape.

This makes it possible to pass the lead through the first through-hole 11*a* formed interior to the sealing member 13 and connect the lead to the power supply part 14 when a lead is to be connected to the power supply part 14. With this, light emitted from the sealing member 13 outward toward the edges of the substrate 11 is not affected by the lead. In other words, the lead, which can cast a shadow, is not present in the region exterior to the light-emitting part (the LEDs 12, the sealing member 13). Consequently, a light-emitting device having a more even luminance distribution can be achieved.

Moreover, by leading the lead through the first through-hole 11*a* in the inner region interior to the sealing member 13, there is no need to extend the lead to the region exterior to the sealing member 13. With this, compared to when the power supply part 14 disposed on the peripheral portion of the substrate 11 the lead is connected to the power supply part 14, a predetermined device in which the light-emitting device 10 is installed can be made more compact.

Moreover, in Embodiment 1, a second through-hole 11*b* for passing through a fixing member for fixing the substrate 11 to a predetermined pedestal is located in the inner region interior to the sealing member 13 formed in an annular shape.

With this, light emitted from the sealing member 13 outward toward the edges of the substrate 11 is not affected by the fixing member. In other words, the fixing member, which can cast a shadow (i.e., a shielding member), is not present in the region exterior to the light-emitting part (the LEDs 12, the sealing member 13). Consequently, a light-emitting device having a more even luminance distribution can be achieved.

Moreover, by forming the second through-hole 11*b* in the inner region interior to the annular sealing member 13, the fixing member can be disposed in the inner region interior to the sealing member 13. Consequently, since the fixing member is not required to be disposed toward the edges of the substrate 11, a predetermined device in which the light-emitting device 10 is installed can be made more compact.

Moreover, in Embodiment 1, a line 15 for electrically connecting the power supply part 14 and the LEDs 12 is disposed in the inner region interior to the sealing member 13 formed in an annular shape.

With this, light emitted from the sealing member 13 outward toward the edges of the substrate 11 can be inhibited from being absorbed by or reflected off the line 15. Consequently, a light-emitting device capable of further inhibiting a reduction in light emission efficiency and having a more even luminance distribution can be achieved.

Moreover, in Embodiment 1, a protective element 18 which electrostatically protects the LEDs 12 is disposed in the inner region interior to the sealing member 13 formed in an annular shape.

With this, light emitted from the sealing member 13 outward toward the edges of the substrate 11 is not affected by the protective element 18. In other words, the protective element 18, which can cast a shadow, is not present in the region exterior to the light-emitting part (the LEDs 12, the sealing member 13). Consequently, a light-emitting device having a more even luminance distribution can be achieved.

Figure 7A:
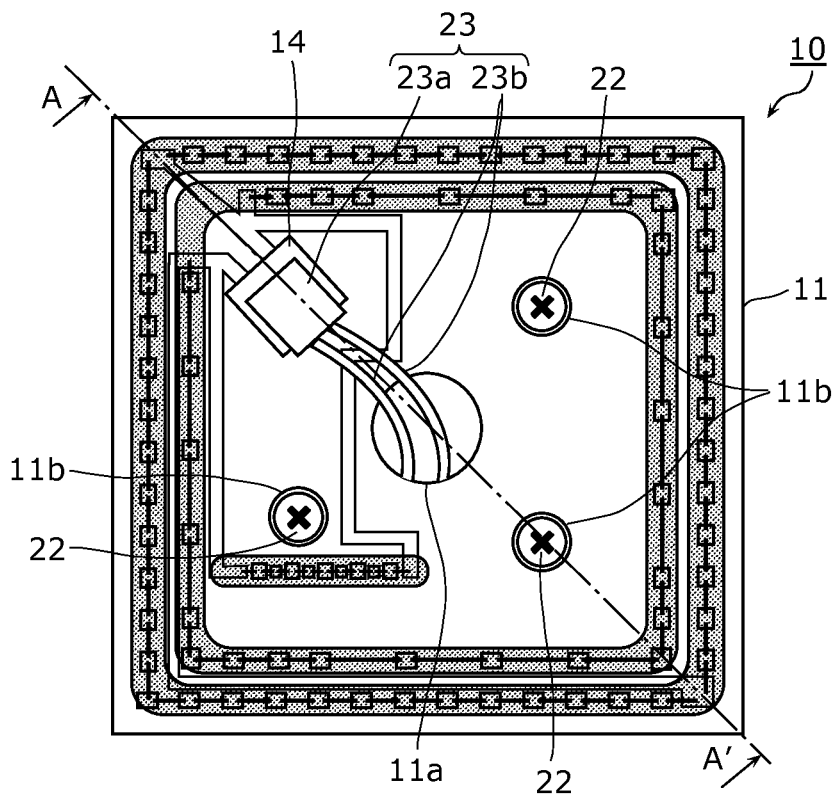
FIG. 7A is a plan view illustrating a light-emitting device according to Embodiment 1 of the present invention while the light-emitting device is fixed to a pedestal.
Figure 7B:
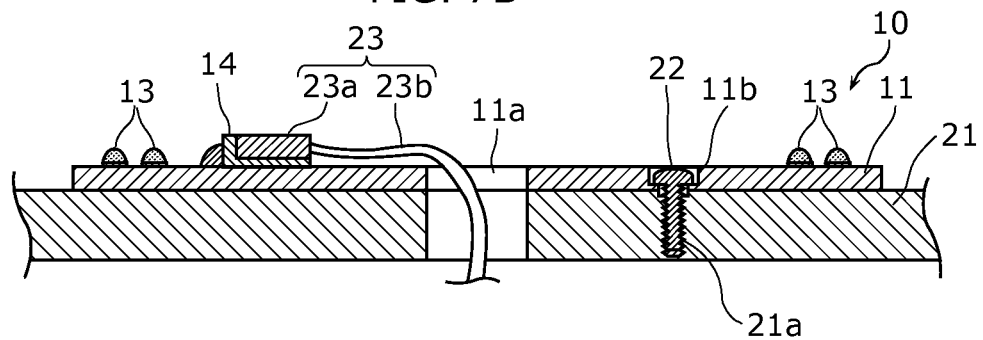
FIG. 7B is a cross sectional view illustrating the light-emitting device according to Embodiment 1 of the present invention while the light-emitting device is fixed to a pedestal (a cross sectional view taken along line A-A' in FIG. 7A).

Next, an example in which the light-emitting device 10 is installed in a predetermined device will be described with reference to FIG. 7A and FIG. 7B. FIG. 7A is a plan view illustrating the light-emitting device according to Embodiment 1 of the present invention while the light-emitting device is fixed to a pedestal. FIG. 7B is a cross sectional view taken along line A-A' in FIG. 7A.

For example, when the light-emitting device 10 is installed in an LED lamp, the light-emitting device 10 is arranged on a metal pedestal (heat sink) 21, as illustrated in FIG. 7B.

The substrate 11 of the light-emitting device 10 is fixed to the pedestal 21 with a screw 22. More specifically, the screw 22 is passed through the second through-hole 11*b* in the substrate 11 and screwed into a screw hole provided in the pedestal 21 to fasten the substrate 11 to the pedestal 21.

Moreover, a lead 23 that passes through a through-hole 21*a* in the pedestal 21 and the first through-hole 11*a* in the substrate 11 is connected to the power supply part 14.

The lead 23 is a power supply lead for supplying power to the light-emitting device 10, and includes, for example, a connector part 23*a* (i.e., a socket connector) for attachment to the socket of the power supply part 14, and a pair of electrically conductive wires 23*b* connected to the connector part 23*a*.

The connector part 23*a* includes an approximately rectangular resin molded part formed so as to mate with the socket of the power supply part 14, and an electrically conductive part provided on the resin molded part. Moreover, the pair of electrically conductive wires 23*b* can be vinyl-covered wires including a metal core covered by a resin coating, for example. In Embodiment 1, the lead 23 is configured to provide DC power, and the pair of electrically conductive wires 23*b* include a positive voltage supply wire for supplying positive voltage and a negative voltage supply wire for supplying negative voltage.

Figure 8:
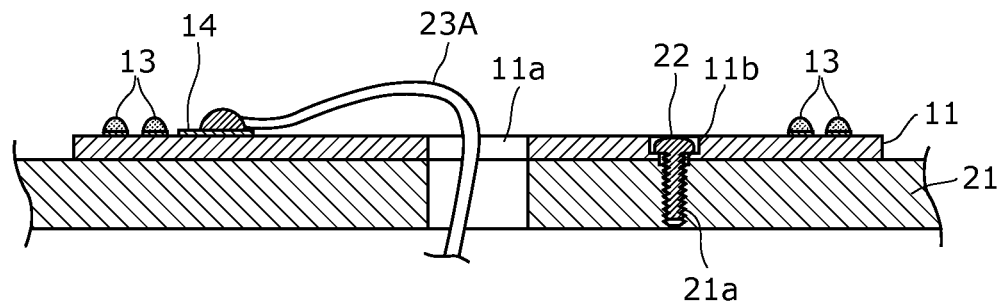
FIG. 8 is a cross sectional view illustrating a different method of connecting a power supply part and a lead in a light-emitting device according to Embodiment 1 of the present invention.

Note that the lead 23 is not required to include the connector part 23*a*; for example, as illustrated in FIG. 8, the lead 23 may be a lead 23A including only a pair of vinyl-covered wires. In this case, as illustrated in FIG. 8, the power supply part 14 is formed as a pair of metal electrodes (metal films), and the metal core wires exposed at the ends of the pair of leads 23A are soldered to the pair of power supply parts 14 to electrically connect the power supply parts 14 and the leads 23A.

Figure 9A:
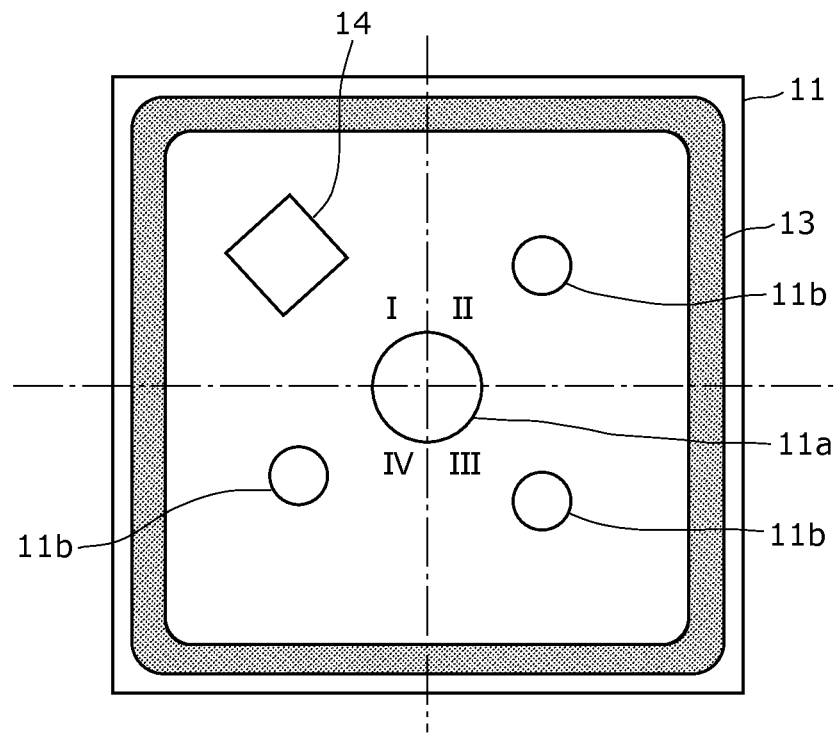
FIG. 9A is a plan view illustrating a layout of a power supply part, a first through-hole, and a second through-hole in a light-emitting device according to Embodiment 1 of the present invention.
Figure 9B:
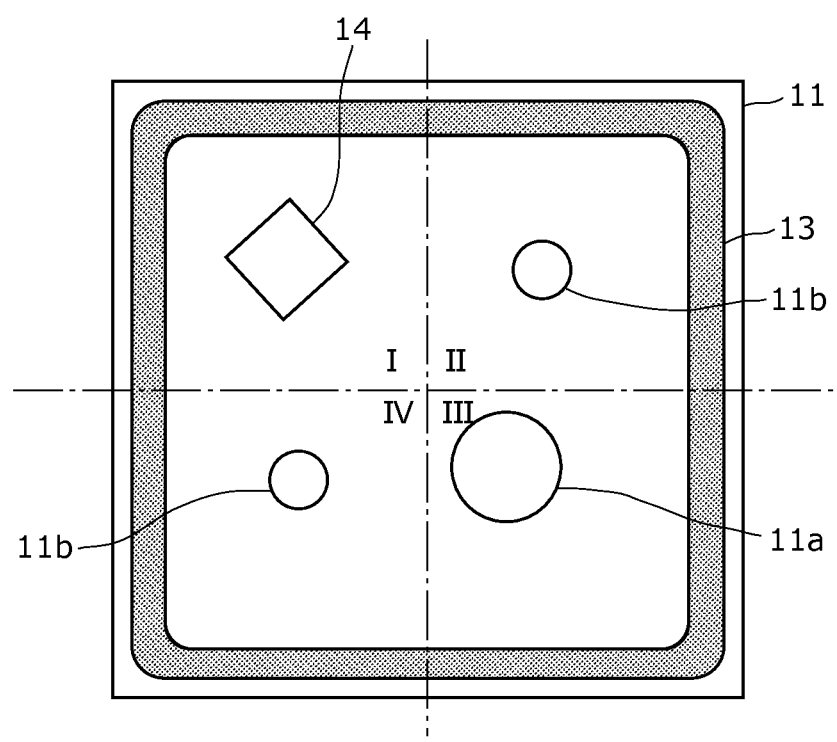
FIG. 9B is a plan view illustrating a different layout of a power supply part, a first through-hole, and a second through-hole in a light-emitting device according to Embodiment 1 of the present invention.

Next, preferred arrangements of the power supply part 14, the first through-hole 11a, and the second through-hole 11b in the light-emitting device 10 will be described with reference to FIG. 9A and FIG. 9B. FIG. 9A is a plan view illustrating a layout of the power supply part, the first through-hole, and the second through-hole in the light-emitting device according to Embodiment 1 of the present invention. FIG. 9B is a plan view illustrating a different layout of the power supply part, the first through-hole, and the second through-hole in the same light-emitting device. Note that in FIG. 9A and FIG. 9B, one sealing member 13 (sealing member line) is shown, but the following also applies if two sealing members 13 (sealing member lines) are formed.

As illustrated in FIG. 9A and FIG. 9B, when the substrate 11 is a quadrilateral in a plan view and the quadrilateral is divided into four regions by connecting a midpoint of each side of the quadrilateral with a center point of the quadrilateral and these regions are defined as orthants, the substrate 11 illustrated in FIG. 9A and FIG. 9B is divided into four orthants—a first orthant I, a second orthant II, a third orthant III, and a fourth orthant IV. Note that since the substrate 11 illustrated in FIG. 9A and FIG. 9B has a square shape in a plan view, the first orthant I, the second orthant II, the third orthant III, and the fourth orthant IV are divided equally.

In this case, the power supply part 14 and the second through-hole 11b are preferably located in different orthants.

For example, in FIG. 7A, the power supply part 14 is disposed in the first orthant I, and three second through-holes 11b are each located in a different one of the second orthant II, the third orthant III, and the fourth orthant IV. Moreover, the first through-hole 11a is located in the central portion of the substrate 11 so as to occupy each of the orthants.

With this configuration, since the power supply part 14 can be disposed in a corner portion, distance between the power supply part 14 and the first through-hole 11a can be gained. Consequently, as illustrated in FIG. 7B, when connecting the lead 23 fed through the first through-hole 11a to the power supply part 14, the bent lead 23 can be easily connected and, after the lead 23 has been connected to the power supply part 14, the resilience of the bent lead 23 can be inhibited. As a result, the stress load on the connection portion of the power supply part 14 and the lead 23 due to the resilience of the bent lead 23 can be reduced. Consequently, it is possible to inhibit the power supply part 14 from becoming disconnected from the substrate 11, the lead 23 from becoming disconnected from the power supply part 14, or the connection portion of the connector part 23a and the electrically conductive wires 23b from breaking in the lead 23.

Moreover, by disposing the power supply part 14 and forming the second through-hole 11b in different orthants, the load placed on the substrate 11 at the power supply part 14 and the second through-hole 11b can be distributed.

For example, in FIG. 9B, the power supply part 14 is disposed in the first orthant I, and two second through-holes 11b are each located in a different one of the second orthant II and the fourth orthant IV. Moreover, the first through-hole 11a is located in the third orthant III, which is opposite the orthant including the power supply part 14 (the first orthant I) across the center of the quadrilateral.

Even with this sort of configuration, the same advantageous effects achieved with the configuration illustrated in FIG. 9A can be achieved. Moreover, with the configuration illustrated in FIG. 9B, the distance between the power supply part 14 and the first through-hole 11a can be lengthened even more than the configuration illustrated in FIG. 9A. This makes it even easier to connect the bent lead 23 and makes it possible to further inhibit the resilience of the bent lead 23. As a result, the stress load on the connection portion of the power supply part 14 and the lead 23 can be reduced even more.

Figure 10A:
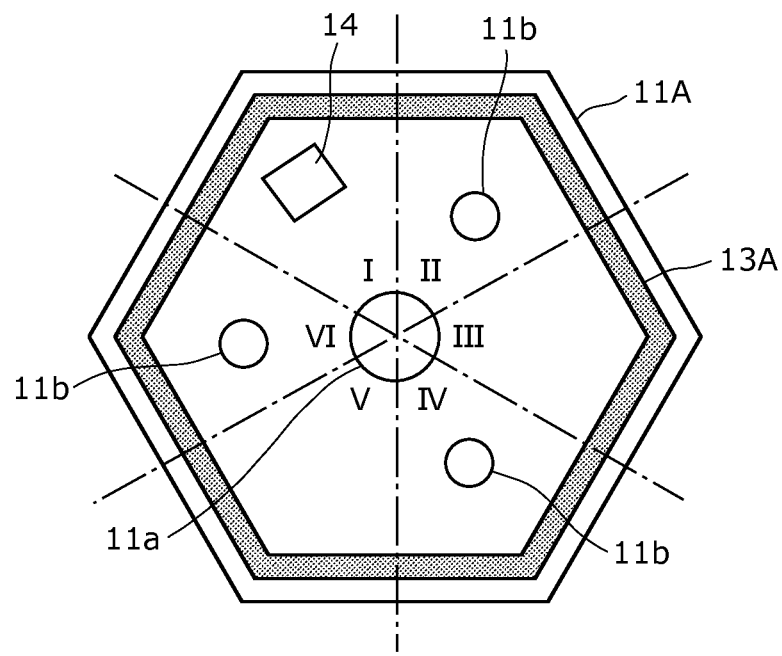
FIG. 10A is a plan view illustrating a configuration when a hexagonal substrate is used in a light-emitting device according to Embodiment 1 of the present invention.
Figure 10B:
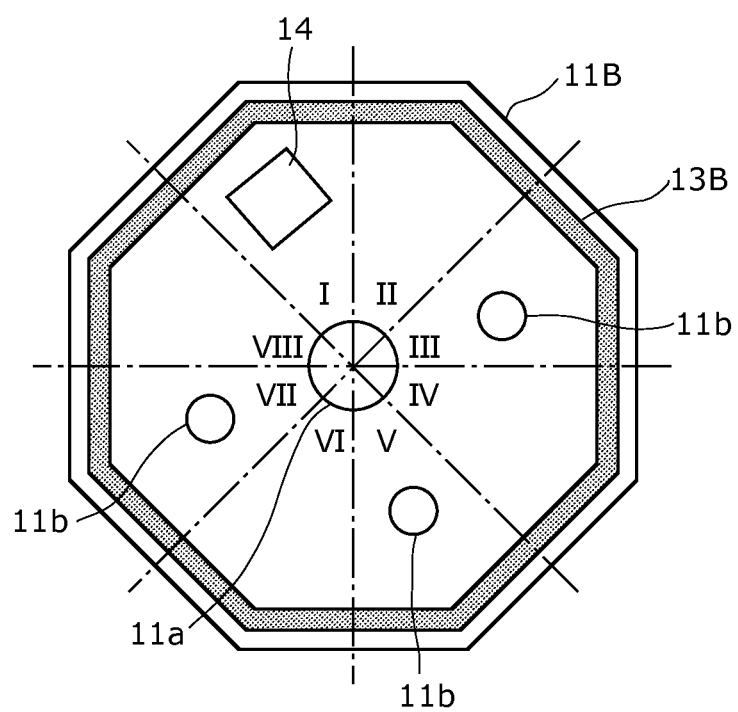
FIG. 10B is a plan view illustrating a configuration when an octagonal substrate is used in a light-emitting device according to Embodiment 1 of the present invention.

As illustrated in FIG. 10A and FIG. 10B, the same applies even when the substrate has a hexagonal or octagonal shape in a plan view. FIG. 10A is a plan view illustrating a configuration when a hexagonal substrate is used in the light-emitting device according to Embodiment 1 of the present invention. FIG. 10B is a plan view illustrating a configuration when an octagonal substrate is used in the light-emitting device according to Embodiment 1 of the present invention.

As illustrated in FIG. 10A, when the substrate 11A is a hexagon in a plan view and the hexagon is divided into six regions by connecting a midpoint of each side of the hexagon with a center point of the hexagon and these regions are defined as orthants, the substrate 11A illustrated in FIG. 10A is divided into six orthants—a first orthant I, a second orthant II, a third orthant III, a fourth orthant IV, a fifth orthant V, and a sixth orthant VI. Note that when, in a plan view, the substrate 11A in FIG. 10A is a hexagon with six sides of equal length, the orthants are divided equally. Note that in FIG. 10A, the sealing member 13A is also formed in a hexagonal shape in accordance with the shape of the substrate 11A.

Moreover, as illustrated in FIG. 10B, when the substrate 11B is an octagon in a plan view and the octagon is divided into eight regions by connecting a midpoint of each side of the octagon with a center point of the octagon and these regions are defined as orthants, the substrate 11B illustrated in FIG. 10B is divided into eight orthants—a first orthant I, a second orthant II, a third orthant III, a fourth orthant IV, a fifth orthant V, a sixth orthant VI, a seventh orthant VII, and an eighth orthant VIII. Note that when, in a plan view, the substrate 11B in FIG. 10B is an octagon with eight sides of equal length, the orthants are divided equally. Note that in FIG. 10B, the sealing member 13B is also formed in an octagonal shape in accordance with the shape of the substrate 11B.

In both FIG. 10A and FIG. 10B, the power supply part 14 and the second through-hole 11b are preferably located in different orthants, and the first through-hole 11a is located in a center of the hexagonal or octagonal polygon, or in orthant which is opposite the orthant including the power supply part 14 across the center of the hexagonal or octagonal polygon.

Similar to the configurations illustrated in FIG. 9A and FIG. 9B, this makes it even easier to connect the bent lead 23 and makes it possible to further inhibit the resilience of the bent lead 23. As a result, the stress load on the connection portion of the power supply part 14 and the lead 23 can be reduced.

(Embodiment 2)

Figure 11A:
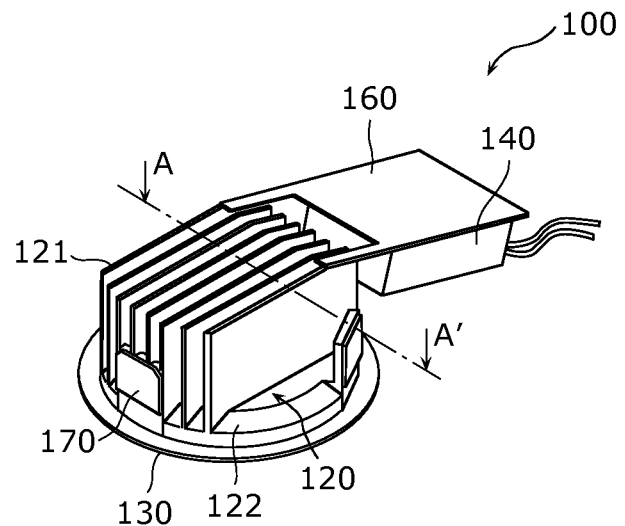
FIG. 11A is an external perspective view of an illumination device according to Embodiment 2 of the present invention.
Figure 11B:
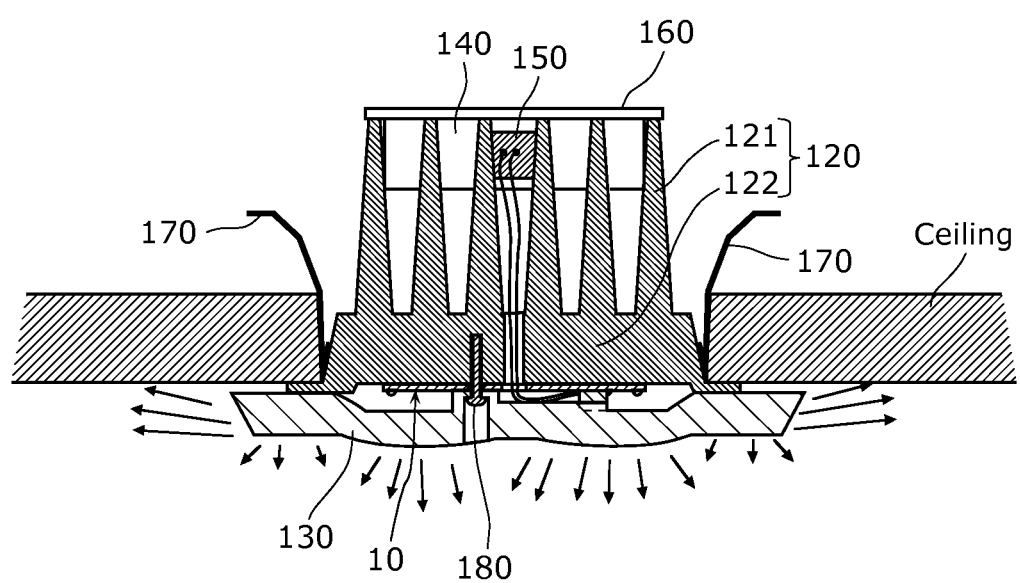
FIG. 11B is cross sectional view of an illumination device according to Embodiment 2 of the present invention, taken along line A-A' in FIG. 11A.

Next, the illumination device 100 according to Embodiment 2 of the present invention will be described with reference to FIG. 11A and FIG. 11B. FIG. 11A is an external perspective view of the illumination device according to Embodiment 2 of the present invention. FIG. 11B is cross sectional view of the illumination device according to Embodiment 2 of the present invention, taken along line A-A' in FIG. 11A.

The illumination device 100 according to Embodiment 2 is a sunken illumination device, such as a recessed light, that includes the light-emitting device 10 according to Embodiment 1 and emits light downward (toward the floor or a wall, for example) by being installed, for example, in the ceiling of a house.

As illustrated in FIG. 11A and FIG. 11B, the illumination device 100 includes the light-emitting device 10, a main body 120, and a lens 130. The illumination device 100 further includes a power source device 140, a terminal base 150, an attachment plate 160, and a fixing spring 170.

The main body 120 is an attachment base for attaching the light-emitting device 10 as well as a heat sink for dissipating heat generated by the light-emitting device 10. The main body 120 can be formed from a metal material, and can be, for example, an aluminum die cast.

A plurality of heat dissipating fins 121 that project upward are disposed on the top portion of the main body 120 (i.e., the portion on the side that is inserted in the ceiling). With this, the heat generated by the light-emitting device 10 can be effectively dissipated.

Moreover, the main body 120 includes an attachment part 122 for attaching and fixing the light-emitting device 10. The light-emitting device 10 is placed on the surface of the attachment part 122. A screw hole 122a is formed in the attachment part 122, and the light-emitting device 10 is fixed to the attachment part 122 with a screw 180.

The lens 130 is a light-transmissive component through which light emitted from the sealing member 13 of the light-emitting device transmits. The lens 130 can be made from an electrically-insulating transparent material, such as a resin material like PMMA (acrylic resin) or polycarbonate, or a glass material. The lens 130 is disposed on the light-emitting side of the light-emitting device 10 so as to cover the light-emitting device 10.

Figure 12:
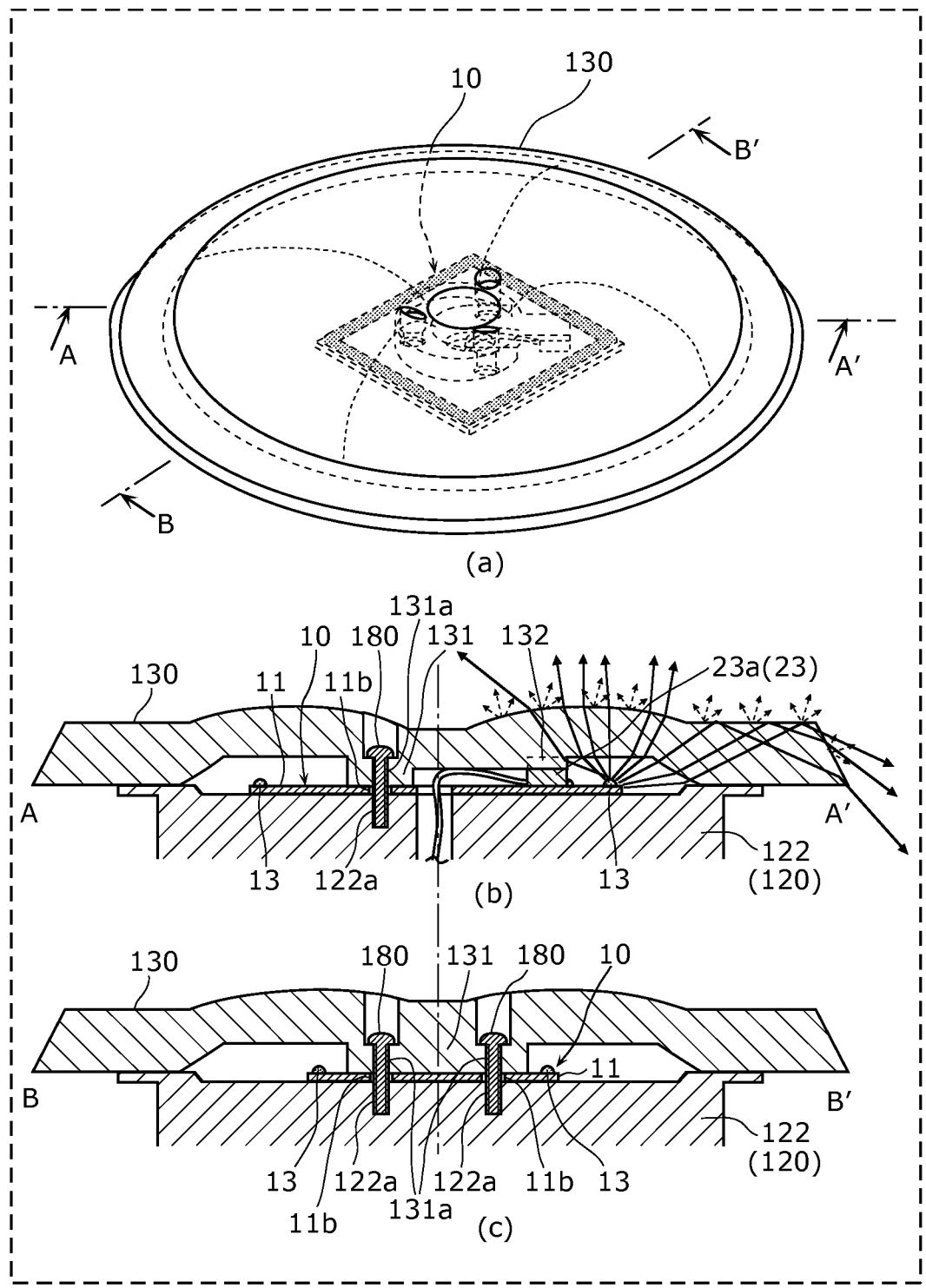
In FIG. 12, (a) illustrates the structure of a lens in an illumination device according to Embodiment 2 of the present invention, (b) is a cross sectional view of the same lens taken along line A-A' in (a), and (c) is a cross sectional view of the same lens taken along line B-B' in (a).

Next, the structure of the lens 130 will be described with reference to FIG. 12. In FIG. 12, (a) illustrates the structure of the lens in the illumination device according to Embodiment 2 of the present invention, (b) is a cross sectional view of the same lens taken along line A-A' in (a), and (c) is a cross sectional view of the same lens taken along line B-B' in (a).

As illustrated in (a) and (b) in FIG. 12, the lens 130 is disc shaped and has an outer surface having a predetermined curvature giving the lens 130 a predetermined lens function. In Embodiment 2, the outer surface of the lens 130 is formed so as to have, in a cross sectional view, a curvature that projects outward in an area corresponding to the sealing member 13 of the light-emitting device 10, and in a plan view, a donut shape.

By providing the lens 130, light emitted from the sealing member 13 of the light-emitting device 10 is focused/diverged in a predetermined direction by the lens function of the lens 130, as illustrated by (b) in FIG. 12. The lens 130 also functions as a cover for the illumination device 100 and protects the light-emitting device 10.

Note that the lens 130 may be provided with a light diffusing function to prevent uneven luminance. For example, the lens 130 may be texture treated to give the outer surface an uneven surface, may be a light diffusing film containing a light diffusing material such as silica, or the lens 130 may be dispersed with a light diffusing material. In Embodiment 2, the entire surface of the lens 130 is treated to have a texture to allow light to leak therethrough.

Moreover, the inner the surface of the lens 130—that is, the surface facing the light-emitting device 10—is formed to have a recessed portion receding toward the outer surface. As illustrated by (a) and (b) in FIG. 12, in the recessed portion, the lens 130 includes, as a portion thereof, a first protruding portion 131 that abuts the substrate 11 of the light-emitting device 10, and a second protruding portion 132 (holding part) that holds down the connector part 23a, of the lead 23, connected to the power supply part 14 of the light-emitting device 10.

The first protruding portion 131 has a through-hole 131a that corresponds to the second through-hole 11b in the substrate 11 of the light-emitting device 10. With this configuration, the lens 130 and the light-emitting device 10 can be fixed to the main body 120 by screwing the screw 180 into the through-hole 131a in the lens 130, the second through-hole 11b in the substrate 11, and the screw hole 122a in the attachment part 122.

Moreover, fixing the lens 130 to the main body 120 presses the connector part 23a of the lead 23 against the second protruding portion 132. As a result, even if a stress load were applied to the connection portion of the power supply part 14 and the lead 23 due to the resilience of the bent lead 23, the pressing force of the second protruding portion 132 would offset the stress load.

Referring back to FIG. 11A and FIG. 11B, the power source device (power source circuit) 140 receives power from a utility power source (for example, AC100V) to generate power for causing the light-emitting device 10 to emit light. Moreover, the terminal base 150 connects the power source device 140 and the light-emitting device 10 and supplies power from the power source device 140 to the light-emitting device 10. Note that the power source device 140 is attached and fixed to the attachment plate 160.

Moreover, the fixing spring (attachment spring) 170 is disposed on the outer peripheral wall of the main body 120. The main body 120 is attached and fixed to the ceiling by the fixing spring 170. The fixing spring 170 is, for example, a rectangular stainless steel plate with one lengthwise end bent into a V-shape, and a plurality of fixing springs 170 (for example, three) are disposed at regular intervals along the circumference of the main body 120.

The illumination device 100 according to Embodiment 2 is capable of having a high light emission efficiency and inhibiting luminance unevenness since the illumination device 100 includes the light-emitting device 10 that inhibits a reduction in light emission efficiency and has an even luminance distribution.

Figure 13:
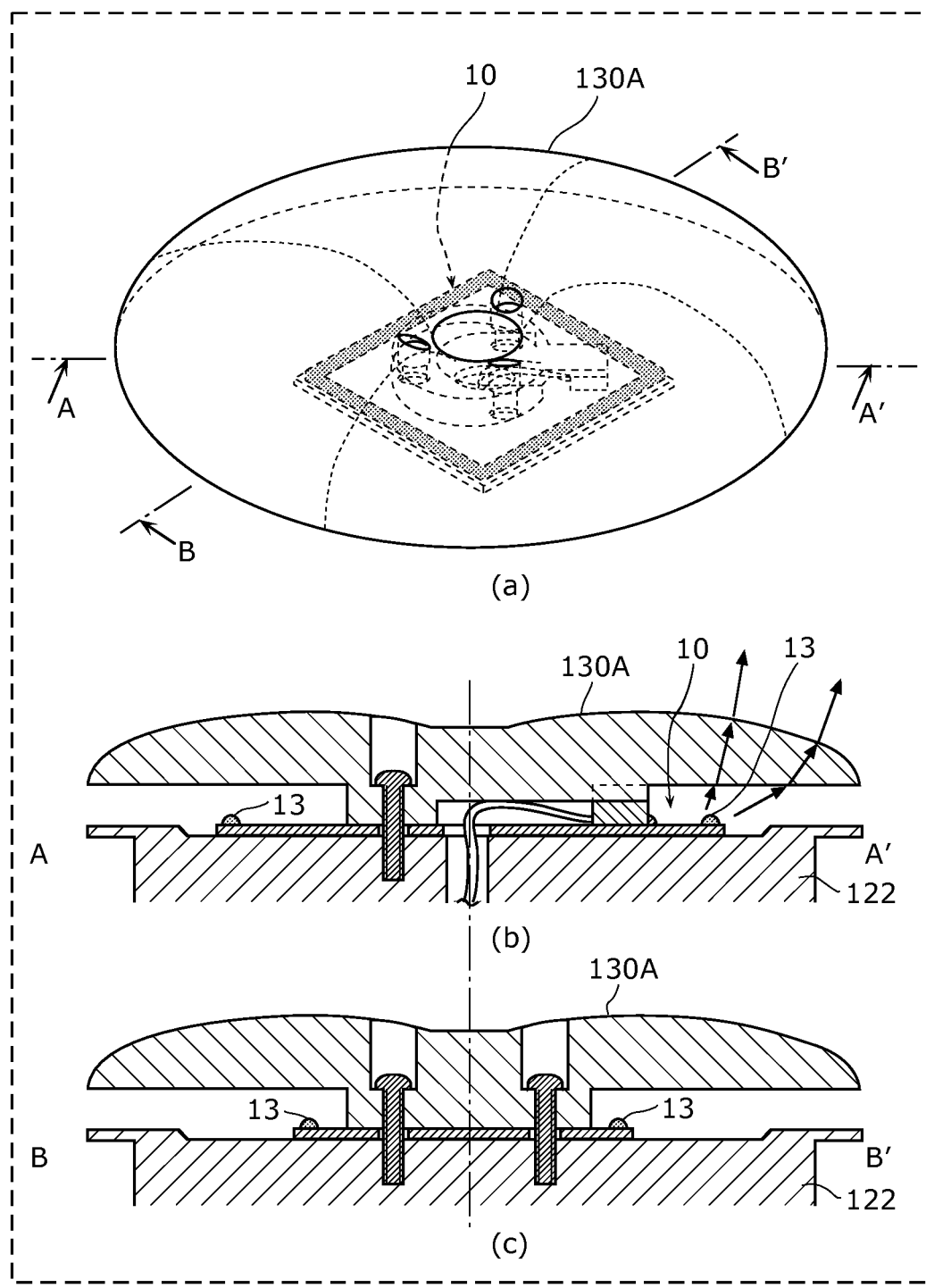
FIG. 13 illustrates Variation 1 of a lens in an illumination device according to Embodiment 2 of the present invention.
Figure 14:
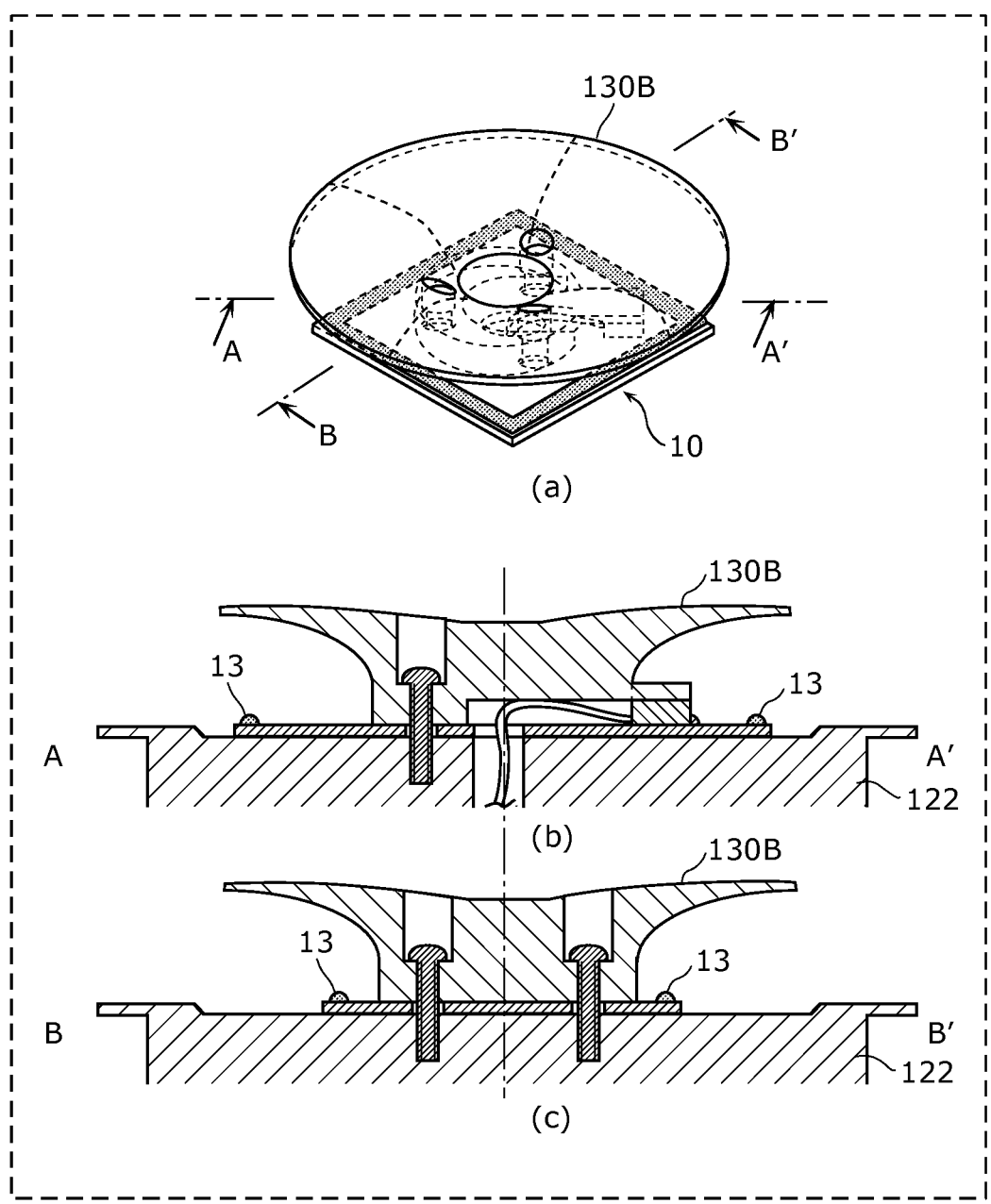
FIG. 14 illustrates Variation 2 of a lens in an illumination device according to Embodiment 2 of the present invention.
Figure 15:
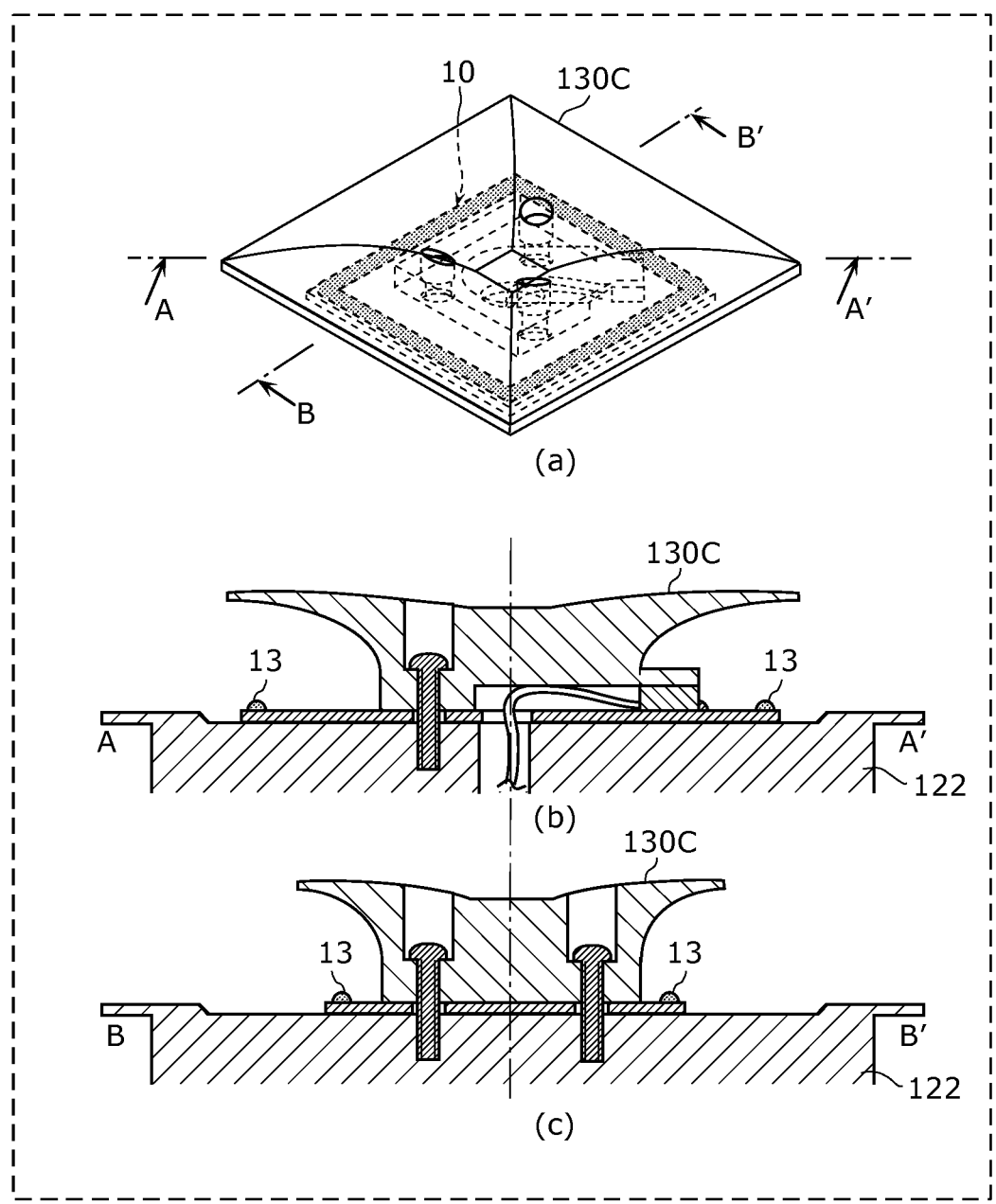
FIG. 15 illustrates Variation 3 of a lens in an illumination device according to Embodiment 2 of the present invention.

Note that in Embodiment 2, the structures illustrated in FIG. 13, FIG. 14, and FIG. 15 may be used as the lens. FIG. 13 illustrates Variation 1 of the lens in the illumination device according to Embodiment 2 of the present invention. FIG. 14 illustrates Variation 2 of the lens in the illumination device according to Embodiment 2 of the present invention. FIG. 15 illustrates Variation 3 of the lens in the illumination device according to Embodiment 2 of the present invention.

The lens 130A illustrated in FIG. 13 differs from the lens 130 illustrated in FIG. 12 in that the inner surface of the lens 130A does not include a portion that is in contact with the attachment part 122, and the inner surface of the lens 130A has a portion opposing the sealing member 13 of the light-emitting device 10 is a planar.

Moreover, the lens 130B and 130C illustrated in FIG. 14 and FIG. 15 are omnidirectional lenses and each have an inner surface that faces the sealing member 13 of the light-emitting device 10 and also functions as a reflective surface. Note that the lens 130B illustrated in FIG. 14 is round in a plan view and the lens 130C illustrated in FIG. 15 is rectangular in a plan view.

(Embodiment 3)

Next, the illumination light source according to Embodiment 3 of the present invention will be described. In Embodiment 3, the illumination light source will be exemplified as a bulb-shaped LED lamp (LED bulb).

Figure 16:
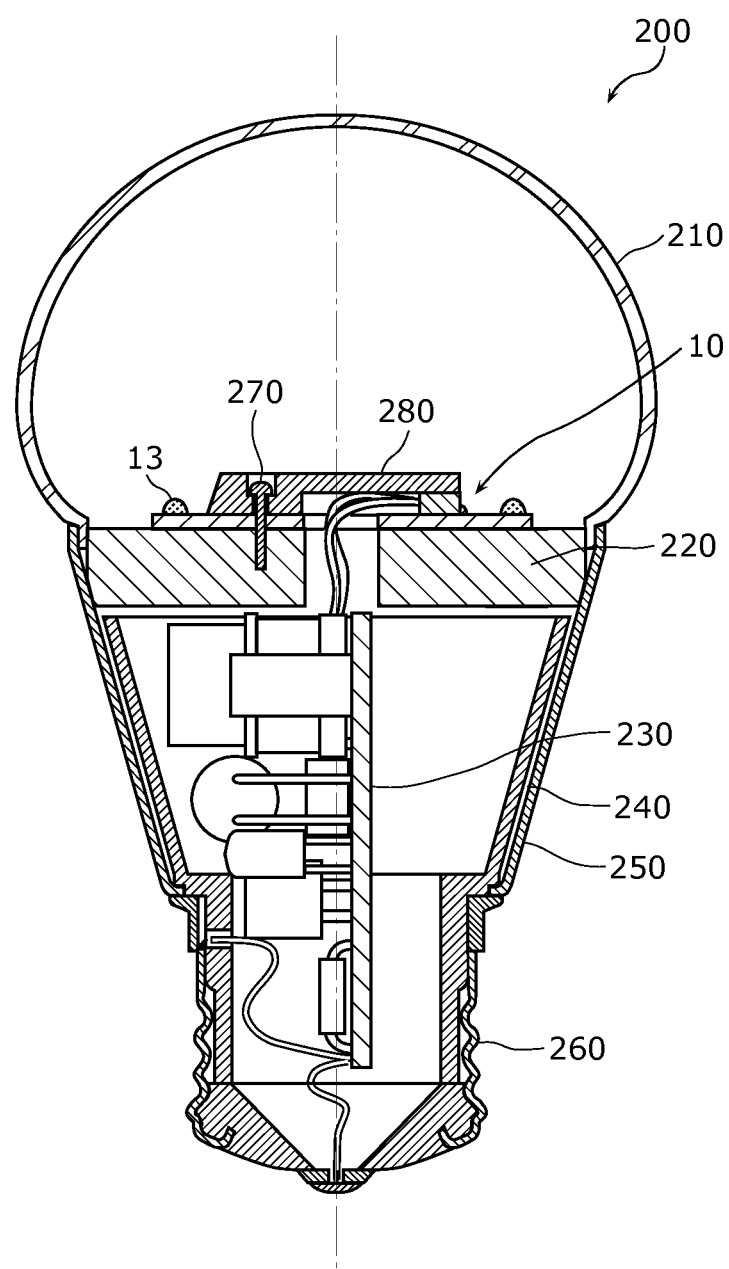
FIG. 16 is a cross sectional view of a bulb-shaped lamp according to Embodiment 3 of the present invention.

FIG. 16 is a cross sectional view of a bulb-shaped lamp according to Embodiment 3 of the present invention.

As illustrated in FIG. 16 the bulb-shaped lamp 200 according to Embodiment 3 is a bulb-shaped LED lamp used as a substitute for a bulb-shaped fluorescent or incandescent lamp, and includes the light-emitting device (LED module) 10 as the light source, a globe 210 that covers the light-emitting device 10, a pedestal 220 on which the light-emitting device 10 is mounted, a circuit unit 230 for causing the light-emitting device 10 to emit light, a circuit holder 240 that houses the circuit unit 230, a housing 250 that covers the circuit holder 240, and a base 260 electrically connected to the circuit unit 230. Note that the outer chassis of the bulb-shaped lamp 200 is formed of the globe 210, the housing 250, and the base 260.

The globe 210 is a semispherical light-transmissive cover through which light emitted by the light-emitting device 10 travels out. For example, a bulb made of glass or a resin such as acrylic resin (PMMA) or polycarbonate (PC) may be used as the globe 210.

The pedestal 220 is a light source attachment member for placing and fixing the light-emitting device 10. When disposed on the pedestal 220, the light-emitting device 10 can be fixed to the pedestal 220 with, for example, a screw 270. The pedestal 220 is fixed by being fitted in the opening of the housing 250. The pedestal 220 can be a metal pedestal formed from a metal material such as aluminum. With this, the heat generated by the light-emitting device 10 can be effectively transferred to the pedestal 220.

Moreover, in Embodiment 3, a resin cover (cover) 280 is provided so as to cover the inner region interior to the sealing member 13 in the light-emitting device 10. The resin cover 280 protects the power supply part 14, the line 15, and the protective elements 18, which are disposed in the inner region interior to the sealing member 13. Moreover, by providing the surface of the resin cover 280 with a reflecting function, the light from the sealing member 13 can be reflected, making it possible to realize a bulb-shaped lamp having a wide light distribution angle. The resin cover 280 is fixed to the substrate 11 and the pedestal 220 by the screw 270.

The circuit unit 230 is a lighting circuit (power source circuit) which supplies predetermined power to the light-emitting device 10 to turn on (cause to emit light) the LEDs 12 in the light-emitting device 10. The circuit unit 230 includes a circuit substrate and a plurality of electronic components mounted on the circuit substrate. The circuit unit 230 is fixed to the circuit holder 240.

The circuit holder 240 is an electrically insulating case for housing the circuit unit 230, and is housed in the housing 250 and the base 260. The circuit holder 240 can be formed from an electrically insulating material such as resin.

The housing 250 is disposed between the globe 210 and the base 260. The housing 250 according to Embodiment 3 is a case with both ends open, and forms the outer layer. The housing 250 can be formed from a metal material such as aluminum.

The base 260 is a receiving part which receives AC power through two electrical contacts, and is, for example, attached to a socket of a lighting fixture. In this case, when the illumination light source 1 is turned on, the base 260 receives power from the socket of the lighting fixture. Moreover, the power received by the base 260 is input into the power input unit of the circuit unit 230.

The base 260 includes a shell portion that is an approximately circular tube shape and has a threaded outer surface, and an eyelet portion attached to the shell portion via an electrically insulating part. The type of base used for the base 260 is not particularly limited, and can be screw-in Edison (E) type base, such as an E26 base, an E17 base, or an E16 base.

With the bulb-shaped lamp 200 according to Embodiment 3, an illumination device can be achieved that has a high light emission efficiency and inhibits luminance unevenness, since the bulb-shaped lamp 200 includes the light-emitting device 10 that inhibits a reduction in light emission efficiency and has an even luminance distribution. Moreover, since the light-emitting device 10 has wide light distribution characteristics, a bulb-shaped lamp having a wide light distribution angle can be achieved.

Note that in Embodiment 3, the resin cover 280 is provided, but the resin cover 280 may be omitted. Moreover, the lens 130, 130A, 130B, or 130C according to Embodiment 2 can be used in place of the resin cover 280. With this, a bulb-shaped lamp having desired light distribution characteristics can be achieved.

Moreover, by installing the bulb-shaped lamp 200 according to Embodiment 3 in a lighting fixture having a predetermined socket, the illumination device can be realized.

(Embodiment 4)

Next, the illumination light source according to Embodiment 4 of the present invention will be described. In Embodiment 4, the illumination light source will be exemplified as a low profile LED lamp.

Figure 17A:
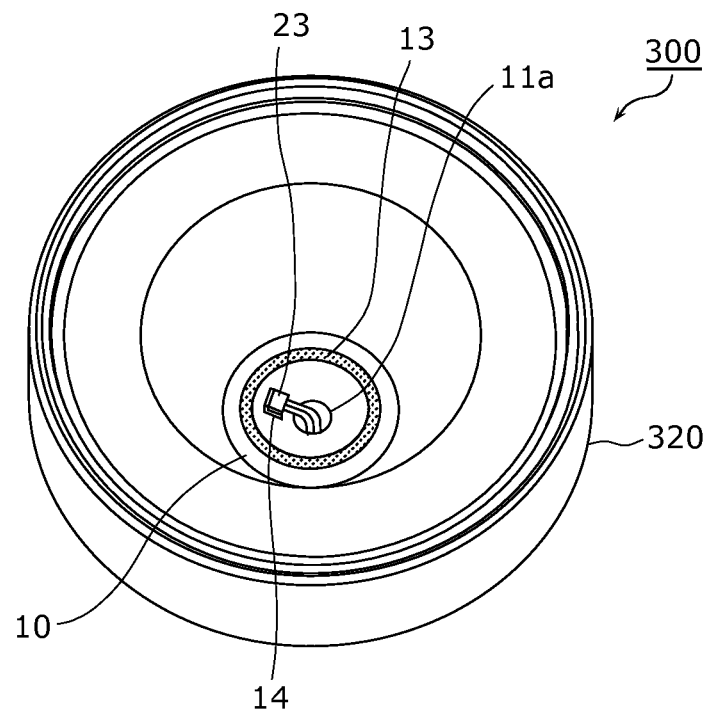
FIG. 17A is an external perspective view of an LED lamp according to Embodiment 4 of the present invention.
Figure 17B:
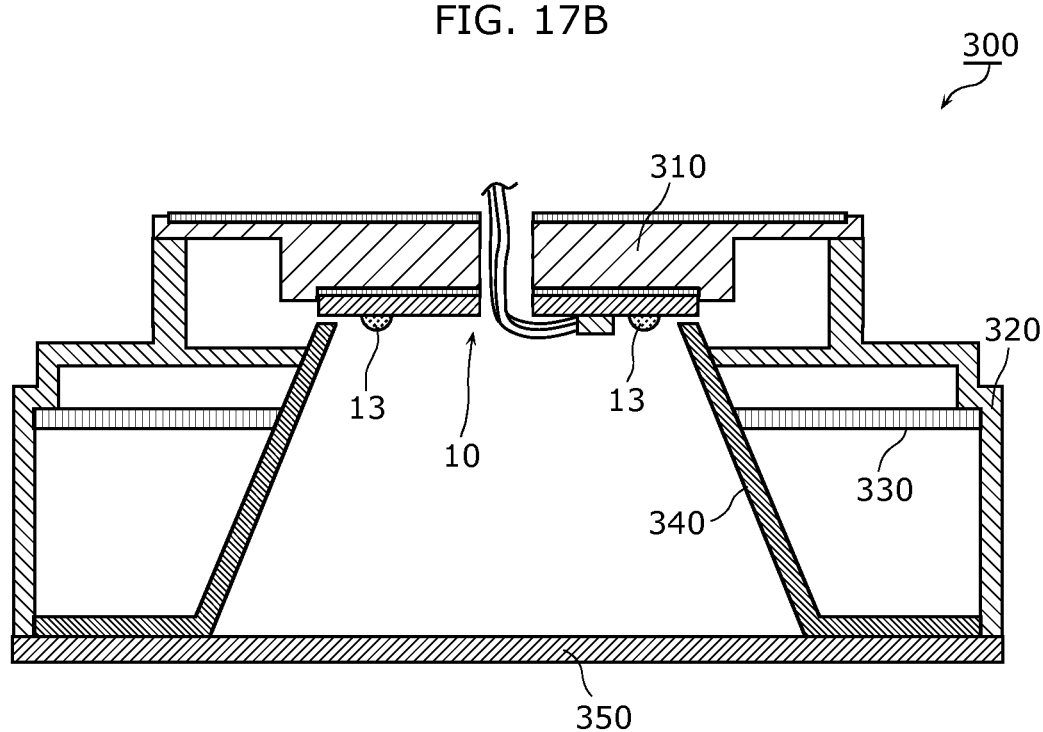
FIG. 17B is a cross sectional view of an LED lamp according to Embodiment 4 of the present invention.

FIG. 17A is an external perspective view of an LED lamp according to Embodiment 4 of the present invention. FIG. 17B is a cross sectional view of an LED lamp according to Embodiment 4 of the present invention.

As illustrated in FIG. 17A and FIG. 17B, the LED lamp 300 according to Embodiment 4 is an LED lamp having an overall discus or low-profile shape, and includes a predetermined standard base (for example, a GH76p base).

The LED lamp 300 includes the light-emitting device 10, a support base 310 for attaching to a lighting fixture (not shown in the drawings), a housing 320 connected to the support base 310, a circuit substrate 330, a reflective mirror 340, and a light-transmissive cover 350. Note that in Embodiment 4, the sealing member 13 of the light-emitting device 10 is formed in a circular annular shape.

The support base 310 is a pedestal for attaching the light-emitting device 10, and can be formed from a metal material such as aluminum. Moreover, the support base 310 is connected to the lighting fixture. More specifically, the top portion of the support base 310 is configured as, for example, a GH76p base, and is attached and fixed to the lighting fixture.

The housing 320 is a low profile, cylindrical housing that surrounds the light emitting side of the LED lamp 300. The light-emitting device 10, the circuit substrate 330, and the reflective mirror 340 are disposed inside the housing 320. The housing 320 can be made from, for example, a resin having electrically insulating properties, such as polybutylene terephthalate (PBT).

The circuit substrate 330 includes a circuit for causing the LEDs 12 in the light-emitting device 10 to emit light. The circuit substrate 330 is a disk-shaped substrate having a hole opened therethrough (i.e., is a donut shaped substrate), and is disposed inside the housing 320 and outside the reflective mirror 340.

The reflective mirror 340 is disposed on the light emitting side of the light-emitting device 10, and is configured so as to reflect light emitted from the light-emitting device 10 and direct the light outward. The reflective mirror 340 can be formed from a white synthetic resin material having electrically insulating properties, such as polycarbonate. Note that the inner surface of the reflective mirror 340 may be coated with a reflective film to increase reflectivity.

The light-transmissive cover 350 is a flat component disposed over the opening of the housing 320, and functions to protect the components disposed inside the housing 320. The light-transmissive cover 350 is formed of a synthetic resin material that has a high transmittance of light, such as polycarbonate, so as to transmit the light from the light-emitting device 10. Note that the inner surface of the light-transmissive cover 350 may be coated with a coating material to facilitate light diffusion.

With the LED lamp 300 according to Embodiment 4, an illumination device can be achieved that has a high light emission efficiency and inhibits luminance unevenness since the LED lamp 300 includes the light-emitting device 10 that inhibits a reduction in light emission efficiency and has an even luminance distribution.

(Variations, Etc.)

The light-emitting device, the illumination light source, and the illumination device according to the present invention have been described based on embodiments, but the present invention is not limited to these embodiments.

(Variation 1)

For example, in the above embodiments, the sealing member 13 in the light-emitting device 10 and the light-emitting device 10A is formed continuously, without interruption, but the sealing member 13 is not limited to this example.

Figure 18:
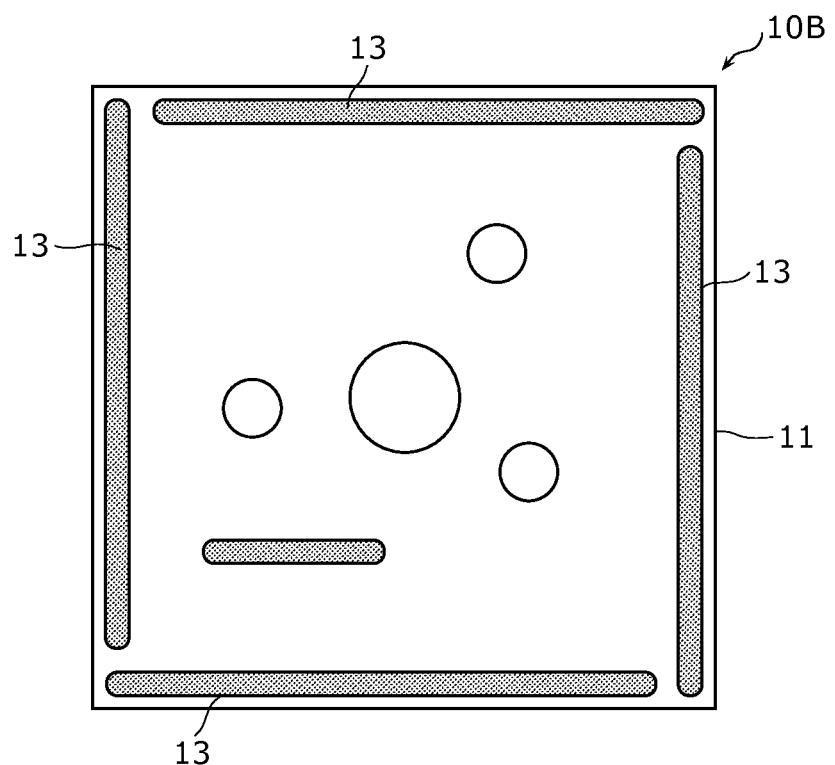
FIG. 18 is a plan view of a first light-emitting device according to Variation 1 of the present invention.

More specifically, as light-emitting device 10B in FIG. 18 illustrates, the sealing member 13 may be formed in straight lines along each edge of the substrate 11 to collectively form an annular sealing member line. In other words, the sealing member 13 may be discontinuously formed in straight lines along each edge of the substrate 11 to form an annular sealing member line.

Figure 19:
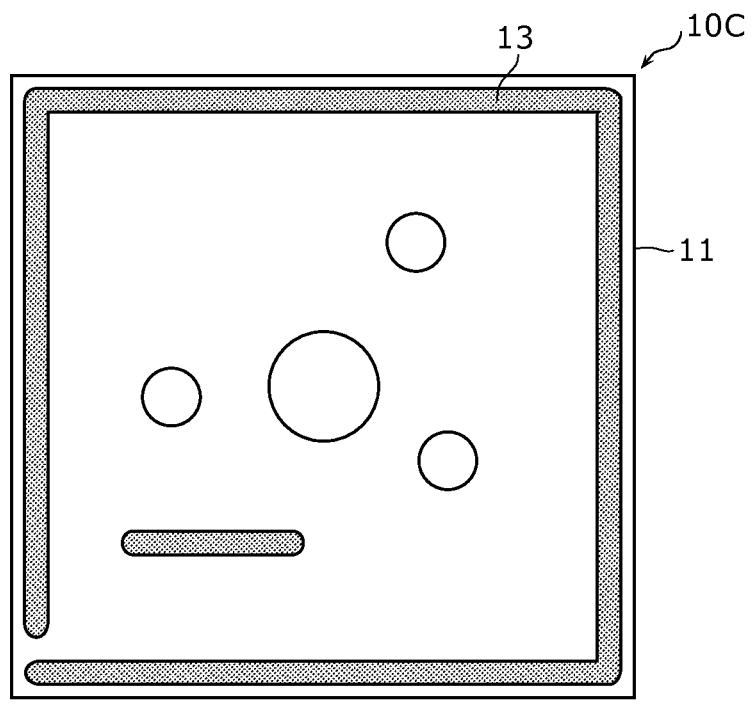
FIG. 19 is a plan view of a second light-emitting device according to Variation 1 of the present invention.

Alternatively, as light-emitting device 10C illustrates in FIG. 19, the sealing member 13 may be formed along the entire perimeter of the substrate 11 with an interruption in one portion so as to form an annular sealing member line.

Thus, so long as the light emitted from the sealing member 13 when the LEDs are caused to emit light is light in a continuous annular shape, a portion of the sealing member may be interrupted; the "annular sealing member" includes configurations which, by extending the sealing member along the shape of the sealing member at the interrupted portion, are annular.

(Variation 2)

Figure 20A:
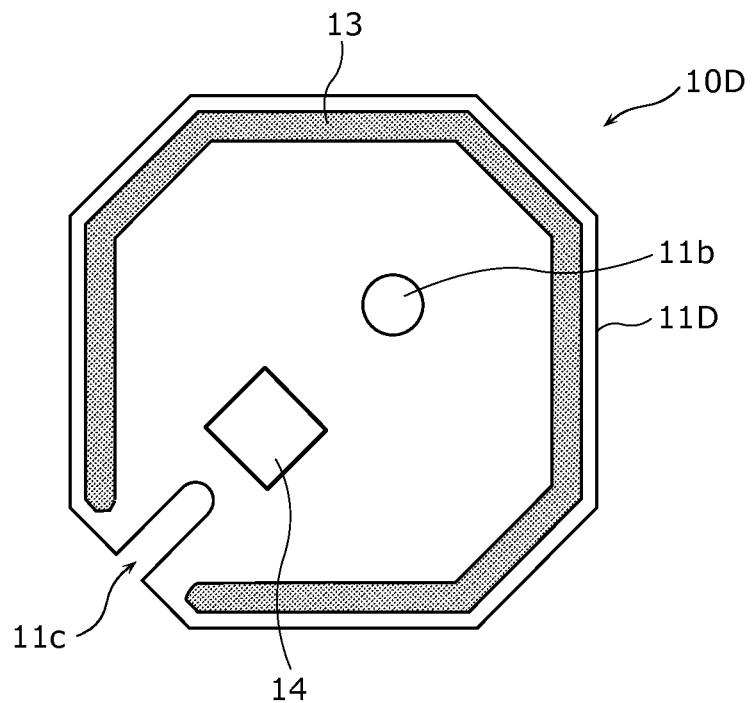
FIG. 20A is a plan view of a first light-emitting device according to Variation 2 of the present invention.

As light-emitting device 10D illustrates in FIG. 20A, a substrate 11D including, in a portion of at least one side of the polygon, a notch 11c may be used. The notch 11c is a recessed portion formed in a portion of at least one edge of the polygonal substrate 11D so as to recede toward the central portion of the substrate. Moreover, the notch 11c is cut through the substrate 11D, from one main surface to the other.

In Variation 2, when viewed in a direction perpendicular to the main surface of the substrate 11D, the substrate 11D has an octagonal shape, and the notch 11 is formed in one portion of one side of the octagonal shape. Note that in accordance with the shape of the substrate 11D, the LEDs (not shown in the drawings) and the sealing member 13 are arranged in an octagonal frame shape.

The notch 11c is an opening for routing a lead (not shown in the drawings) connected to the power supply part 14 (base connector), and the lead passes through the notch 11c. The lead 23 illustrated in FIG. 7A and FIG. 7B can be used as the lead. The lead can be inserted through the notch 11c in a direction from the side of the substrate 11D toward the interior of the substrate 11D, along the shape of the notch, rather than in a direction perpendicular to the main surface of the substrate 11D.

With this, even if the end portion of the lead were to include a connector terminal (socket connector) as the connecting part with the power supply part 14, the lead can be easily inserted through the notch 11c regardless of the size of the connector terminal. In other words, since there is no need to pass the connector terminal of the lead through the notch 11c, the width of the notch 11c can be kept to roughly the width of the lead. Consequently, portions of the substrate 11D which are penetrated through (i.e., ineffective surface area of the substrate 11D) include the second through-hole 11b for a screw and the notch 11c for routing wiring, but since these portions can be kept to a minimal surface area, the effective surface area of the substrate 11D can be kept as large as possible.

Figure 20B:
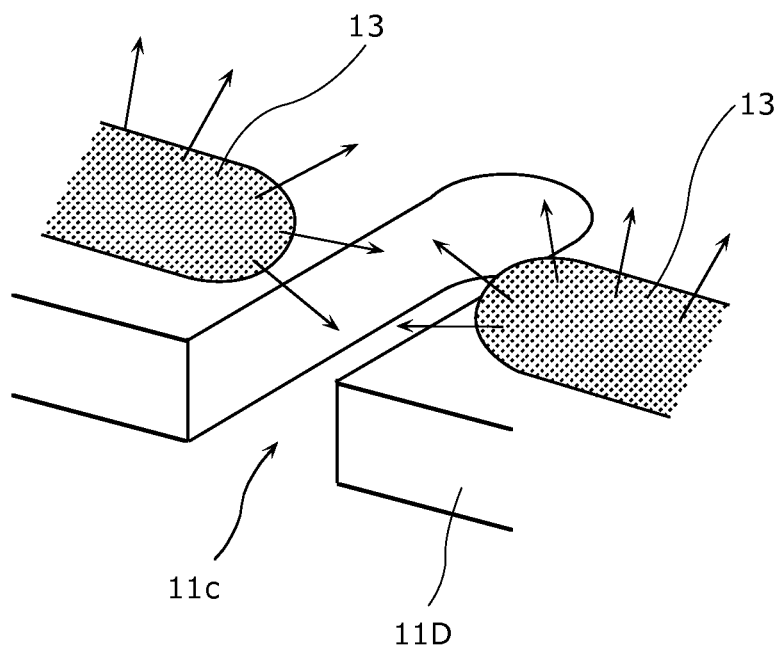
FIG. 20B is an enlarged view of a portion of a second light-emitting device according to Variation 2 of the present invention.

Moreover, when the substrate 11D includes the notch 11c, the annularly shaped sealing member 13 is interrupted by the notch 11c, but as illustrated in FIG. 20B, light also emits in a direction horizontal to the substrate (in a direction toward the edges) from the ends of the sealing member 13 formed by the interruption. With this, light is emitted from the light-emitting device 10D in a continuous annular shape, without being interrupted by the notch 11. In particular, as illustrated in FIG. 20B, forming the ends of the sealing member 13 at the interruption to oppose each other across the notch 11c makes it easier to achieve light that is continuous without interruption.

Moreover, a white ceramic substrate may be used as the substrate 11D. This makes it easier to reflect light emitted from the ends of the sealing member 13 formed by the interruption, off the inner surface of the notch 11c. This in turn makes it easier to achieve continuous light.

Note that in Variation 2, the number of second through-holes 11b for screws is not limited to one. For example, as illustrated by the light-emitting device 10E in FIG. 21, a plurality of second through-holes 11b may be formed (for example, two).

Figure 21:
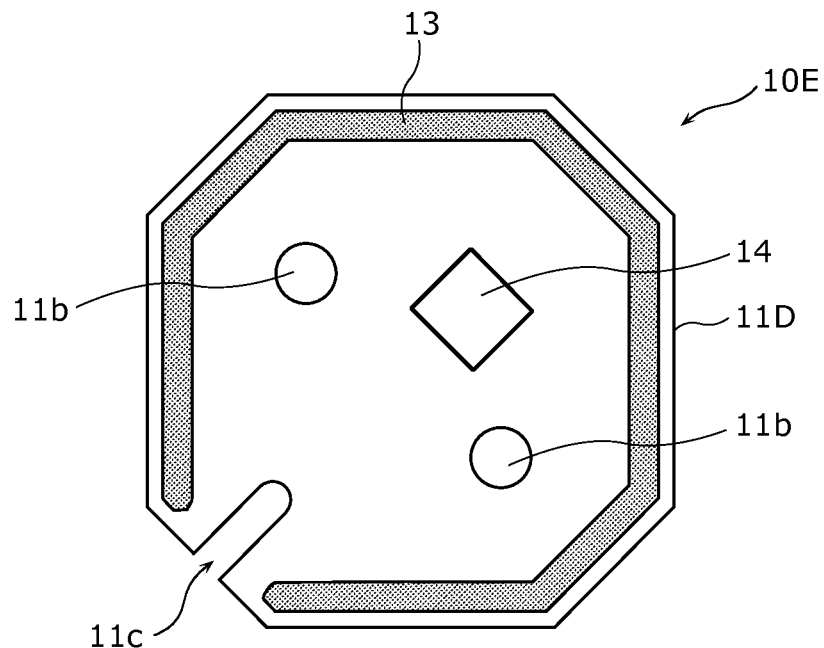
FIG. 21 is a plan view of a second light-emitting device according to Variation 2 of the present invention.

Moreover, as also illustrated in FIG. 21, the power supply part 14 may be disposed in a location away from the notch 11c in order to gain distance between the power supply part 14 and the notch 11. With this, the lead connected to the power supply part 14 will bend where the lead comes through the notch 11c, but by distancing the power supply part 14 from the notch 11c, stress load placed on the connection portion of the power supply part 14 and the lead by the bend can be reduced.

Consequently, it is possible to inhibit the power supply part 14 from becoming disconnected from the substrate 11, the lead from becoming disconnected from the power supply part 14, or a portion of the lead from breaking.

Figure 22:
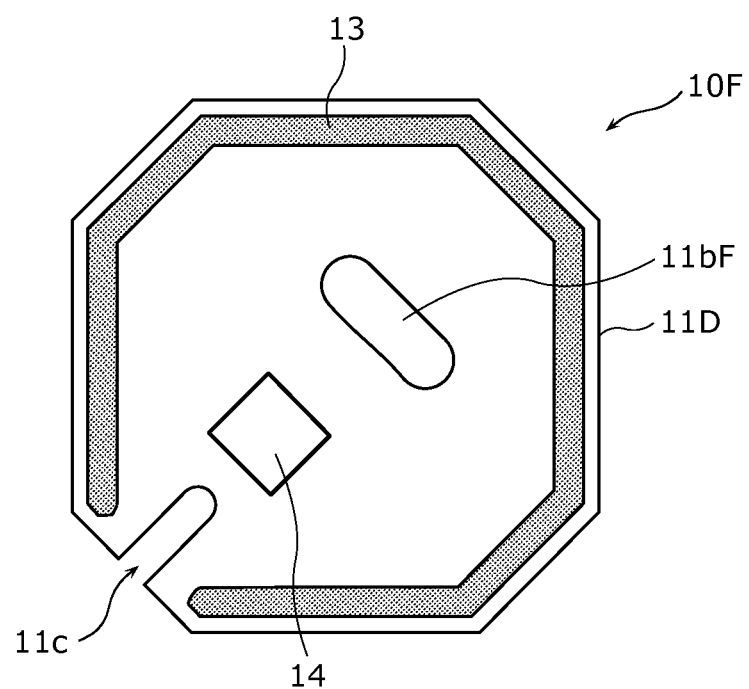
FIG. 22 is a plan view of a third light-emitting device according to Variation 2 of the present invention.

Moreover, as the light-emitting device 10F illustrates in FIG. 22, the second through-hole 11bF for a screw may have an elongated shape. More specifically, the second through-hole 11bF has an oval shape (is a long hole). With this, the light-emitting device 10F can be easily positioned and kept from rotating by forming a protruding portion on the pedestal on which the light-emitting device 10F is mounted and fitting the protruding portion into the second through-hole 11bF. Alternatively, when a lens is disposed in front of the light-emitting device 10F, the lens can be easily positioned and kept from rotating by fitting a protruding portion provided on the lens for attachment purposes, into the second through-hole 11bF.

Figure 23:
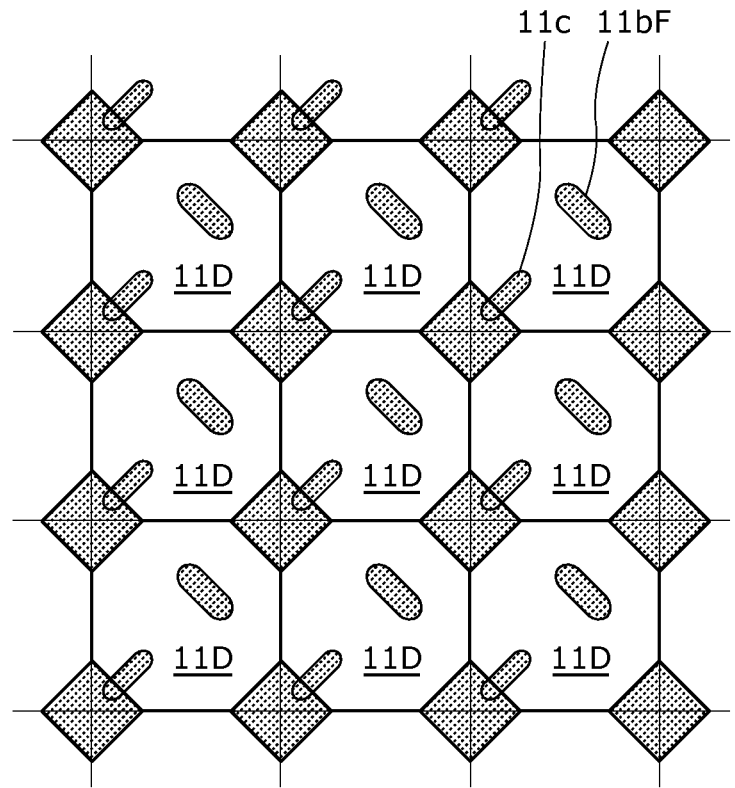
FIG. 23 illustrates substrates of a third light-emitting device according to Variation 2 of the present invention before being cut from a base substrate.

Moreover, the octagonal substrate 11D according to Variation 2 is, for example, manufactured by dividing a base substrate (mother substrate) into multiple pieces. More specifically, the octagonal substrate 11D can be manufactured by laser cutting the substrate 11D from a mother substrate, as illustrated in FIG. 23. Note that in FIG. 23, the shaded areas indicate portions that are disposed of after cutting out the substrates 11D (i.e., the portions that are cut out).

When cutting out the substrates 11D from the mother substrate, the notch 11c and the second through-hole 11bF can also be formed by laser cutting. Note that a larger region than what is actually intended is often cut (overcut) when laser cutting the mother substrate, so the notches 11c may be designed to overlap with the portions that are cut away, as illustrated in FIG. 23. For example, there is concern that an adjacent substrate 11D may be cut into when the notch 11c is being cut out of a corner of the polygon. Thus, the notch 11c may be cut out of a side of the polygon rather than a corner of the polygon.

Note that compared to forming the substrate 11D in a round shape, forming the substrate 11D in a polygonal shape such as an octagon makes it possible to reduce portions of the mother substrate that are cut and thrown away.

Moreover, in Variation 2, two opposing sides of the octagonal shape of substrate 11D are equal in length and parallel to each other, and two adjacent sides of the octagonal shape have different lengths. In other words, the substrate 11D is not an octagon with eight sides of equal length. Compared to forming the substrate 11D as an octagon with eight sides of equal length, this makes it possible to reduce portions of the mother substrate that are cut away.

Figure 24:
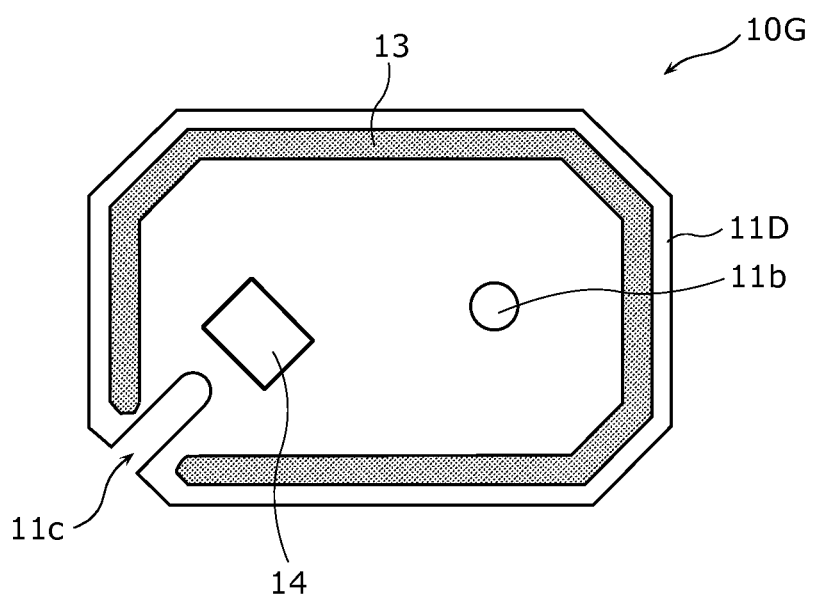
FIG. 24 is a plan view of a fourth light-emitting device according to Variation 2 of the present invention.

Note that the octagonal substrate may have an elongated shape, such as substrate 11D in light-emitting device 10G illustrated in FIG. 24.

(Other Variations)

The light-emitting device, the illumination light source, and the illumination device according to the present invention have been described based on embodiments and variations thereof, but the present invention is not limited to these embodiments and variations.

For example, in the above embodiments and variations, the shape of the substrate and the shape of the sealing member correspond, but the present invention is not limited to this example. For example, when the substrate has a square shape, the sealing member has a frame-like square shape (FIG. 1), when the substrate has a hexagonal shape, the sealing member has a frame-like hexagonal shape (FIG. 10A), and when the substrate has an octagonal shape, the sealing member has a frame-like octagonal shape (FIG. 10B), but the present invention is not limited to this example. In other words, the sealing member (sealing line) and the LEDs (element line) are disposed so as to be parallel to the edge of the substrate, the shape in which the LEDs are arranged and the shape of the sealing member may be determined irrespective of the shape of the substrate in a plan view. For example, the LEDs and the sealing member may be arranged in a circular annular shape on a substrate having a polygonal shape in a plan view, and conversely, the LEDs 12 and the sealing member 13 may be arranged in a frame-like polygonal shape on a substrate having a circular shape in a plan view.

Moreover, in the above embodiments and variations, the light-emitting device is configured to emit white light using a blue LED chip and a yellow phosphor, but the present invention is not limited to this example. For example, in order to increase color rendering properties, in addition to the yellow phosphor, a red phosphor or a green phosphor may be mixed in. Moreover, a configuration is possible in which, without using a yellow phosphor, a phosphor-containing resin which includes red and green phosphors is used which, when used in combination with a blue LED chip, yields white light.

Moreover, in the above embodiment and variations, the LED chip may be an LED chip which emits light of a color other than blue. For example, when an LED chip which emits ultra-violet rays is used, a combination of phosphors which respectively emit the three primary colors (red, green, and blue) can be used as the phosphor (phosphor particles). Furthermore, wavelength converting materials other than phosphor particles may be used. For example, materials including a substance which absorbs a certain wavelength of light and emits light of a different wavelength, such as semiconductors, metal complexes, organic dyes, and pigments, may be used as the wavelength converting material.

Moreover, although the light-emitting element is exemplified as an LED in the above embodiments and variations, a semiconductor light-emitting element such as a semiconductor laser, or a solid light-emitting element such as an organic or inorganic electroluminescence (EL) element may be used as the light-emitting element.

Although only exemplary embodiments of the present invention and variations thereof have been described in detail above, those skilled in the art will readily appreciate that many modifications are possible in the exemplary embodiments and variations without materially departing from the novel teachings and advantages of the present invention. Accordingly, all such modifications are intended to be included within the scope of the present invention.

INDUSTRIAL APPLICABILITY

The present invention is widely applicable in, for example light-emitting devices including light-emitting elements, and illumination light sources and illumination devices such as lights including said light-emitting devices.

REFERENCE SIGNS LIST 10, 10A, 10B, 10C, 10D, 10E, 10F, 10G light-emitting device
11, 11A, 11B, 11D substrate
11a first through-hole
11b, 11bF second through-hole
11c notch
12, 12a, 12bLED
12L1 first element line
12L2 second element line
13, 13A, 13B sealing member
13L1 first sealing line
13L2 second sealing line
13L3 third sealing line
14 power supply part
15 line
16 pad
17, 17a, 17b, 17c wire 18 protective element
19 marker
21 pedestal
21*a*, 131*a* through-hole
22, 180 screw
23, 23A lead
23*a* connector part
23*b* electrically conductive wire
100 illumination device
120 main body
121 heat dissipating fins
122 attachment part
122*a* screw hole
130, 130A, 130B, 130C lens
131 first protruding portion
132 second protruding portion
140 power source device
150 terminal base
160 attachment plate
170 fixing spring
200 bulb-shaped lamp
210 globe
220 pedestal
230 circuit unit
240 circuit holder
250 housing
260 base
270 screw
280 resin cover
300 LED lamp
310 support base
320 housing
330 circuit substrate
340 reflective mirror
350 light-transmissive cover

The invention claimed is:

1. A light-emitting device comprising:
a substrate, the substrate including an opening;
a plurality of light-emitting elements that are positioned annularly on a main surface of the substrate;
an annularly shaped sealing member provided on the substrate, the annularly shaped sealing member extends continuously along the annularly positioned plurality of light-emitting elements and seals the plurality of light-emitting elements; and
a power supply disposed on the main surface of the substrate and electrically connected to the plurality of light-emitting elements by a lead that extends through the opening, the power supply and the opening being positioned to maximize a distance therebetween, the lead including an electrically conductive wire that overlaps the substrate, in a plane view,
wherein the power supply is located in an inner region that is interior to the annularly shaped sealing member.

2. The light-emitting device according to claim 1,
wherein the plurality of light-emitting elements are arranged along a peripheral portion of the substrate.

3. The light-emitting device according to claim 1,
wherein the opening of the substrate comprises a first through-hole, the lead which connects to the power supply extending through the first through-hole, and
the first through-hole is located in the inner region.

4. The light-emitting device according to claim 1,
wherein the sealing member extends continuously, without interruption and collectively seals the annularly positioned plurality of light emitting elements.

5. The light-emitting device according to claim 1,
wherein the substrate has a polygonal shape when viewed in a direction perpendicular to the main surface of the substrate,
the opening of the substrate comprises a notch in a portion of at least one side of the polygonal shape, and
the sealing member is interrupted by the notch.

6. The light-emitting device according to claim 1,
wherein the substrate has a polygonal shape when viewed in a direction perpendicular to the main surface of the substrate,
the plurality of light-emitting elements each have a rectangular shape when viewed in the direction perpendicular to the main surface of the substrate, and
a long side of the rectangular shape and a side of the polygonal shape are substantially parallel.

7. The light-emitting device according to claim 1,
wherein the substrate has an octagonal shape when viewed in a direction perpendicular to the main surface of the substrate, and
two opposing sides of the octagonal shape are equal in length and parallel to each other, and two adjacent sides of the octagonal shape have different lengths.

8. The light-emitting device according to claim 1,
wherein the substrate has a second through-hole and a fixing member for fixing the substrate to a pedestal, the fixing member extending through the second through-hole, and
the second through-hole is located in the inner region.

9. The light-emitting device according to claim 1,
wherein all of the plurality of light-emitting elements are disposed at arbitrary intersections of lines of a virtual grid which are spaced at a uniform pitch on the substrate.

10. The light-emitting device according to claim 1,
wherein the substrate includes a marker for indicating a mounting location of each of the plurality of light-emitting elements.

11. The light-emitting device according to claim 1, further comprising:
a line patterned on the substrate, for electrically connecting the power supply and the plurality of light-emitting elements,
wherein the line is located in the inner region.

12. The light-emitting device according to claim 1, further comprising:
a protective element which electrostatically protects the plurality of light-emitting elements,
wherein the protective element is located in the inner region.

13. The light-emitting device according to claim 1,
wherein the sealing member includes a wavelength converting material which converts a wavelength of light emitted from the plurality of light-emitting elements.

14. An illumination light source comprising:
the light-emitting device according to claim 1.

15. An illumination device comprising:
the light-emitting device according to claim 1.

16. The light-emitting device according to claim 5,
wherein the lead which connects to the power supply passes through the notch.

17. The light-emitting device according to claim 8,
wherein the substrate has a polygonal shape when viewed in a direction perpendicular to the main surface of the substrate, the polygonal shape being rectangular, hexagonal, or octagonal, and when the polygonal shape is divided into a plurality of orthants by connecting a midpoint of each side of the polygonal shape with a center point of the polygonal shape, the power supply and the second through-hole are located in different orthants of the plurality of orthants.

18. The light-emitting device according to claim 17, wherein the first through-hole is located at the center point of the polygonal shape, or located in, among the plurality of orthants, an orthant opposing an orthant including the power supply, across the center point of the polygonal shape.

19. A light-emitting device comprising:
a substrate;
a plurality of light-emitting elements that are positioned annularly on a main surface of the substrate;
an annularly shaped sealing member provided on the substrate, the annularly shaped sealing member extends continuously along the annularly positioned plurality of light-emitting elements and seals the plurality of light-emitting elements;
a power supply disposed on the main surface of the substrate and electrically connected to the plurality of light-emitting elements, and
a pad electrically connected to the plurality of light-emitting elements,
wherein the power supply is located in an inner region that is interior to the annularly shaped sealing member,
wherein the plurality of light-emitting elements are arranged in a polygonal shape when viewed in a direction perpendicular to the main surface of the substrate,
the pad is located in a corner portion of the polygonal shape, and
two of the plurality of light-emitting elements disposed about the corner portion are wire bonded via the pad.

20. An illumination device comprising:
a light-emitting device comprising:
a substrate;
a plurality of light-emitting elements that are positioned annularly on a main surface of the substrate;
an annularly shaped sealing member provided on the substrate, the annularly shaped sealing member extends continuously along the annularly positioned plurality of light-emitting elements and seals the plurality of light-emitting elements; and
a power supply disposed on the main surface of the substrate and electrically connected to the plurality of light-emitting elements,
wherein the power supply is located in an inner region that is interior to the annularly shaped sealing member,
the illuminiation device comprising:
a lens which transmits light emitted from the sealing member, and a lead including a connector which connects to the power supply,
wherein the lens includes a holder which holds down the connector.

* * * * *